(12) United States Patent
Nagatani et al.

(10) Patent No.: US 10,243,664 B2
(45) Date of Patent: Mar. 26, 2019

(54) OPTICAL MODULATOR DRIVER CIRCUIT AND OPTICAL TRANSMITTER

(71) Applicant: NIPPON TELEGRAPH AND TELEPHONE CORPORATION, Tokyo (JP)

(72) Inventors: Munehiko Nagatani, Tokyo (JP); Hideyuki Nosaka, Tokyo (JP); Toshihiro Itoh, Tokyo (JP); Koichi Murata, Tokyo (JP); Hiroyuki Fukuyama, Tokyo (JP); Takashi Saida, Tokyo (JP); Shin Kamei, Tokyo (JP); Hiroshi Yamazaki, Tokyo (JP); Nobuhiro Kikuchi, Tokyo (JP); Hiroshi Koizumi, Tokyo (JP); Masafumi Nogawa, Tokyo (JP); Hiroaki Katsurai, Tokyo (JP); Hiroyuki Uzawa, Tokyo (JP); Tomoyoshi Kataoka, Tokyo (JP); Naoki Fujiwara, Tokyo (JP); Hiroto Kawakami, Tokyo (JP); Kengo Horikoshi, Tokyo (JP); Yves Bouvier, Tokyo (JP); Mikio Yoneyama, Tokyo (JP); Shigeki Aisawa, Tokyo (JP); Masahiro Suzuki, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 45 days.

(21) Appl. No.: 14/889,127

(22) PCT Filed: May 9, 2014

(86) PCT No.: PCT/JP2014/062480
§ 371 (c)(1),
(2) Date: Nov. 4, 2015

(87) PCT Pub. No.: WO2014/181869
PCT Pub. Date: Nov. 13, 2014

(65) Prior Publication Data
US 2016/0087727 A1 Mar. 24, 2016

(30) Foreign Application Priority Data

May 9, 2013 (JP) .................................. 2013-099025
May 13, 2013 (JP) .................................. 2013-100929

(51) Int. Cl.
*H04B 10/54* (2013.01)
*H03F 1/32* (2006.01)
(Continued)

(52) U.S. Cl.
CPC ........... *H04B 10/541* (2013.01); *H03F 1/223* (2013.01); *H03F 1/32* (2013.01); *H03F 3/04* (2013.01);
(Continued)

(58) Field of Classification Search
CPC ........ H03G 3/3084; H03G 3/001; H03G 3/00; H03G 1/0088; H03F 1/223; H03F 3/195;
(Continued)

(56) References Cited

U.S. PATENT DOCUMENTS 6,278,325 B1 8/2001 Juang
7,605,660 B1 * 10/2009 Kobayashi .............. H03F 1/083
330/254
(Continued)

FOREIGN PATENT DOCUMENTS

CN 102819120 A 12/2012
EP 2584718 A1 4/2013
(Continued)

OTHER PUBLICATIONS

3rd, New Optical Transmission Technologies by Digital Signal Processing—100 G and Beyond—, Proceedings of the IEICE, Optical Communication System Technical Committee, pp. 9-13, 2012.
(Continued)

*Primary Examiner* — Mina M Shalaby
(74) *Attorney, Agent, or Firm* — Womble Bond Dickinson (US) LLP

(57) ABSTRACT

An optical modulator driver circuit (1) includes an amplifier (50, Q10, Q11, R10-R13), and a current amount adjustment
(Continued)

circuit (51) capable of adjusting a current amount of the amplifier (50) in accordance with a desired operation mode. The current amount adjustment circuit (51) includes at least two current sources (IS10) that are individually ON/OFF-controllable in accordance with a binary control signal representing the desired operation mode.

13 Claims, 33 Drawing Sheets

(51) Int. Cl.
| | |
|---|---|
| *H03F 3/04* | (2006.01) |
| *H03F 3/60* | (2006.01) |
| *H03G 3/00* | (2006.01) |
| *H04B 10/516* | (2013.01) |
| *H03F 1/22* | (2006.01) |
| *H03F 3/195* | (2006.01) |
| *H03F 3/24* | (2006.01) |
| *H03F 3/45* | (2006.01) |
| *H03G 3/30* | (2006.01) |
| *H03F 3/08* | (2006.01) |
| *H03G 1/00* | (2006.01) |

(52) U.S. Cl.
CPC ............ *H03F 3/082* (2013.01); *H03F 3/195* (2013.01); *H03F 3/245* (2013.01); *H03F 3/45085* (2013.01); *H03F 3/45089* (2013.01); *H03F 3/45183* (2013.01); *H03F 3/45188* (2013.01); *H03F 3/602* (2013.01); *H03G 1/0088* (2013.01); *H03G 3/00* (2013.01); *H03G 3/001* (2013.01); *H03G 3/3084* (2013.01); *H04B 10/516* (2013.01); *H03F 2200/18* (2013.01); *H03F 2200/219* (2013.01); *H03F 2200/255* (2013.01); *H03F 2200/27* (2013.01); *H03F 2200/336* (2013.01); *H03F 2200/411* (2013.01); *H03F 2200/72* (2013.01); *H03F 2200/75* (2013.01); *H03F 2203/45258* (2013.01); *H03F 2203/45374* (2013.01); *H03F 2203/45392* (2013.01); *H03F 2203/45454* (2013.01); *H03F 2203/45466* (2013.01); *H03F 2203/45471* (2013.01); *H03F 2203/45486* (2013.01); *H03F 2203/45496* (2013.01); *H03F 2203/45504* (2013.01); *H03F 2203/45506* (2013.01); *H03F 2203/45702* (2013.01)

(58) Field of Classification Search
CPC ...... H03F 3/245; H03F 3/45183; H03F 3/602; H03F 1/32; H03F 3/04; H03F 3/45085; H03F 3/45089; H03F 3/45188; H03F 3/082; H03F 2200/336; H03F 2200/411; H04B 10/541; H04B 10/516
See application file for complete search history.

(56) References Cited

U.S. PATENT DOCUMENTS

| | | | |
|---|---|---|---|
| 7,848,369 B1* | 12/2010 | Bostak | G02F 1/0121 359/237 |
| 2005/0052070 A1 | 3/2005 | Kim et al. | |
| 2005/0276289 A1 | 12/2005 | Kim et al. | |
| 2006/0127102 A1* | 6/2006 | Roberts | H04B 10/505 398/182 |
| 2009/0131099 A1 | 5/2009 | Miyashita | |
| 2009/0243717 A1* | 10/2009 | Bonthron | H03F 3/45089 330/10 |
| 2012/0141062 A1* | 6/2012 | Smith | G01C 19/726 385/3 |
| 2012/0249232 A1* | 10/2012 | Tatsumi | H03F 3/45089 330/53 |
| 2012/0314277 A1 | 12/2012 | Matsuda et al. | |
| 2013/0101296 A1 | 4/2013 | Nishimoto | |
| 2013/0302037 A1* | 11/2013 | Wernlund | H04B 10/2503 398/141 |

FOREIGN PATENT DOCUMENTS

| | | | | |
|---|---|---|---|---|
| GB | 2436651 A | 10/2007 | | |
| JP | H 09-252228 A | 9/1997 | | |
| JP | 2000-209046 A | 7/2000 | | |
| JP | 2002-246861 A | 8/2002 | | |
| JP | 2005-086832 A | 3/2005 | | |
| JP | 2010-272919 A | 12/2010 | | |
| JP | 2011-160257 A | 8/2011 | | |
| JP | WO 2011096369 A1 * | 8/2011 | ........... | H04B 10/564 |
| JP | 2012-255929 A | 12/2012 | | |

OTHER PUBLICATIONS

Miyamoto et al., "Advanced Optical Modulation and Multiplexing Technologies for High-Capacity OTN Based on 100 Gb/s Channel and Beyond", IEEE Communications Magazine, vol. 48, No. 3, pp. s65-s72, 2010.
Search Report in European Patent Application No. 14794331.0 dated Feb. 9, 2017. 5 pages.
Sato et al., "A Wide Dynamic Range Variable Gain Amplifier with Enhanced IP1 dB and Temperature Compensation", IEICE Transactions on Electronics, Institute of Electronics, vol. E94-C, No. 8, Aug. 2011, pp. 1311-1319.
Office Action received for European Patent Application No. 14794331.0, dated Jul. 11, 2018, 12 pages.
Office Action received for European Patent Application No. 14794331.0, dated Jan. 18, 2018, 8 pages.
International Search Report and Written Opinion received for PCT Patent Application No. PCT/JP2014/062480, dated Jul. 1, 2014, 12 pages (6 pages of English Translation and 6 pages of Original Document).
International Preliminary Report on Patentability received for PCT Patent Application No. PCT/JP2014/062480, dated Nov. 19, 2015, 10 pages (6 pages of English Translation and 4 pages of Original Document).
"Decision to refuse EP application," EP Application No. 14794331.0 (dated Jan. 18, 2019).

* cited by examiner

QPSK
(CONSTELLATION)

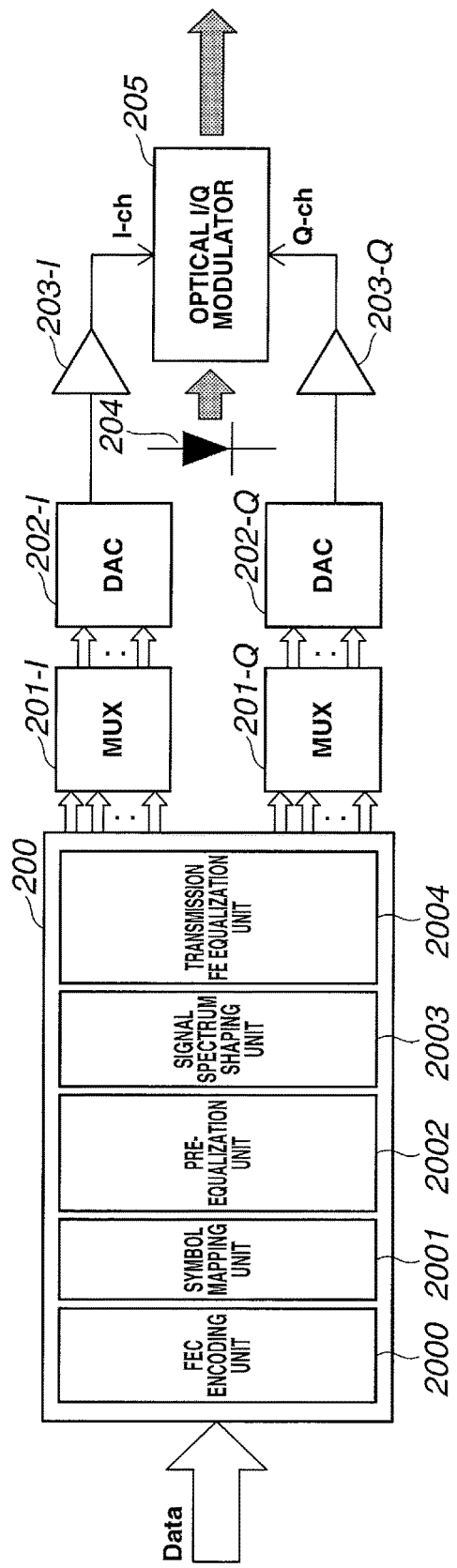

16-QAM
(CONSTELLATION)

OPTICAL MODULATOR DRIVER CIRCUIT AND OPTICAL TRANSMITTER

TECHNICAL FIELD

The present invention relates to an optical modulator driver circuit capable of switching between a low-power/limit operation mode and a linear operation mode in accordance with the operation configuration of an optical transmission system, and an optical transmitter using the optical modulator driver circuit.

BACKGROUND ART

In recent years, the digital coherent technology and the multilevel modulation technology, which combine digital signal processing and coherent detection, have received attention to further increase the speed and capacity of an optical transmission system. Research and development of an optical transmission system that attains 100 Gb/s per wavelength using polarization multiplexing and a QPSK (Quadrature Phase Shift Keying) modulation format and devices for the 100-Gb/s optical transmission system has extensively been pursued now. In addition, to make the 100-Gb/s optical transmission system more sophisticated and improve its transmission quality, applying digital signal processing such as Nyquist filter or pre-equalization to the transmission end has been examined. Furthermore, utilization of a higher-order multilevel modulation format such as QAM (Quadrature Amplitude Modulation) has also been examined to realize a transmission technology of 400-Gb/s class per wavelength.

FIG. 40 shows an example of the arrangement of a general optical transmitter for 100 Gb/s transmission. FIG. 40 shows a transmission block for one polarized wave out of polarization multiplexing. The optical transmitter shown in FIG. 40 includes a DSP (Digital Signal Processor) unit 100 that performs digital signal processing of transmission data Data, multiplexers (MUXs) 101-I and 101-Q that multiplex symbols output from the DSP unit 100, optical modulator driver circuits 102-I and 102-Q that amplify signals output from the MUXs 101-I and 101-Q, a laser diode (LD) 103, and an optical I/Q modulator 104 that modulates continuous light from the LD 103 by the output signals from the optical modulator driver circuits 102-I and 102-Q and outputs the signal. FIG. 41A is a view showing the output signal of the MUX 101-I. FIG. 41B is a view showing the output signal of the optical modulator driver circuit 102-I. FIG. 41C is a constellation diagram showing, on a plane, the optical output signal of the optical I/Q modulator 104.

The DSP unit 100 includes an FEC (Forward Error Correction) encoding unit 1000 that performs FEC encoding for the transmission data Data, and a symbol mapping unit 1001 that executes symbol mapping according to a modulation format for the signal that has undergone the FEC encoding. As described above, since the 100-Gb/s optical transmission system uses the modulation format of QPSK, the electrical signal that drives the optical I/Q modulator 104 is a binary signal. For this reason, the optical modulator driver circuits 102-I and 102-Q need to perform a limit operation (operation of limit-amplifying both a small signal and a large signal up to a desired amplitude value) to improve the eye opening of the modulator driving waveform. In other words, requirement of linearity (characteristic for linearly amplifying an input signal) is not high in the optical modulator driver circuits 102-I and 102-Q used in the 100-Gb/s optical transmission system.

FIG. 42 shows an example of the arrangement of an optical transmitter capable of using transmission end signal processing and also coping with a higher-order modulation format such as QAM. FIG. 42 also shows a transmission block for one polarized wave out of polarization multiplexing. The optical transmitter shown in FIG. 42 includes a DSP unit 200 that performs digital signal processing of the transmission data Data, MUXs 201-I and 201-Q that multiplex symbols output from the DSP unit 200, D/A converters (DACs: Digital to Analog Converters) 202-I and 202-Q that convert data output from the MUXs 201-I and 201-Q into analog signals, optical modulator driver circuits 203-I and 203-Q that amplify signals output from the DACs 202-I and 202-Q, an LD 204, and an optical I/Q modulator 205 that modulates continuous light from the LD 204 by the output signals from the optical modulator driver circuits 203-I and 203-Q and outputs the signal. FIG. 43A is a view showing the output signal of the DAC 202-I. FIG. 43B is a view showing the output signal of the optical modulator driver circuit 203-I. FIG. 43C is a constellation diagram showing, on a plane, the optical output signal of the optical I/Q modulator 205.

The DSP unit 200 includes a pre-equalization unit 2002 that performs, for the signal, pre-equalization processing of wavelength dispersion or nonlinear response of an optical modulator, a signal spectrum shaping unit 2003 that performs spectrum shaping (Nyquist filter) processing for the signal to suppress inter-channel crosstalk at the time of WDM (Wavelength Division Multiplexing) transmission, and a transmission FE equalization unit 2004 that performs, for the signal, transmission FE (Forward Equalizer) equalization for the optical modulator, in addition to an FEC encoding unit 2000 that performs FEC encoding for the transmission data Data and a symbol mapping unit 2001 that executes symbol mapping according to a modulation format for the signal that has undergone the FEC encoding. The functions of the pre-equalization unit 2002, the signal spectrum shaping unit 2003, and the transmission FE equalization unit 2004 can be ON/OFF-controlled as needed (see literature "3rd, New Optical Transmission Technologies by Digital Signal Processing—100 G and Beyond—, Proceedings of the IEICE, Optical Communication System Technical Committee, pp. 9-13, 2012).

The arrangement shown in FIG. 42 is largely different from the conventional 100-Gb/s optical transmitter shown in FIG. 40 in that linearity is important. When the simple QPSK format is used, the electrical signal that drives the optical I/Q modulator 104 is a binary signal "0" or "1", as described above. However, when Nyquist filter or pre-equalization processing is applied, or a higher-order multilevel modulation format with amplitude modulation such as QAM is used, the electrical signal that drives the optical I/Q modulator 205 is not a simple "0" or "1" signal but a signal finely including information in the amplitude axis direction. As an example easy to understand, when a 16-QAM format is used, the electrical signal that drives the optical I/Q modulator 205 is a quaternary signal, as shown in FIG. 43C.

As described above, when transmission end signal processing or QAM format is used, the electrical signal that drives the optical modulator finely includes information in the amplitude axis direction. For this reason, the optical modulator driver circuit needs to linearly respond, that is, linearly amplify the input signal. Additionally, an optical transmitter as shown in FIG. 42 can cover a conventional system that handles a binary signal.

DISCLOSURE OF INVENTION

Problem to be Solved by the Invention

In an actual scene of utilization, even when an optical transmitter as shown in FIG. 42 is used, signal processing such as Nyquist filter is not necessarily applied, and an operation is assumed to be performed by ON/OFF-controlling the function as needed. A flexible operation configuration is also considerable in which a single optical transmitter sometimes uses QPSK and sometimes uses QAM. In this case, requirement of linearity for the optical modulator driver circuit also changes depending on the use condition.

If an optical modulator driver circuit having excellent linearity, as described above, is used, transmission quality to some extent is guaranteed in any case. However, a linear driver circuit generally consumes more power than a conventional limit type driver circuit that handles a binary signal. The reason will be explained with reference to FIGS. 44A and 44B. FIG. 44A is a graph showing the input/output characteristic of a limit type driver circuit. FIG. 44B is a graph showing the input/output characteristic of a linear driver circuit. In FIGS. 44A and 44B, the abscissa represents the amplitude (or input power) of an input signal Vin, and the ordinate represents the amplitude (or output power) of an output signal Vout of the driver circuit.

When handling a binary signal, obtaining a desired output amplitude Aout necessary to drive the optical modulator with respect to an assumed input amplitude Ain suffices, and distortion of the waveform poses no series problem. Hence, as is apparent from FIG. 44A, since the circuit can be designed by setting a maximum amplitude Aoutmax of a signal outputtable by the driver circuit as the desired output amplitude Aout (Aoutmax≈Aout), the power efficiency is very high. Additionally, when handing a binary signal, the driver circuit preferably performs the limit operation from the viewpoint of improving the eye opening of the optical modulator driving waveform.

On the other hand, in the linear driver circuit, the linear operation range needs to be wide. It is therefore necessary to design the circuit so as to ensure the sufficiently large maximum amplitude Aoutmax of the signal outputtable by the driver circuit itself and linearly obtain the desired output amplitude Aout with respect to the assumed input amplitude Ain (design the circuit so as to attain a large backoff). The power consumption of a general driver circuit increases in proportion to the maximum output amplitude of the circuit. Hence, the power consumption of the linear driver circuit increases.

The present invention has been made to solve the above-described problem, and provides an optical modulator driver circuit capable of switching between a low-power/limit operation mode and a linear operation mode in accordance with an applied modulation format, equalization processing, or the like, and an optical transmitter using the optical modulator driver circuit.

Means of Solution to the Problem

According to the present invention, there is provided an optical modulator driver circuit comprising an amplifier that amplifies an input signal and outputs a signal to drive an optical modulator, and a current amount adjustment circuit capable of adjusting a current amount of the amplifier in accordance with a desired operation mode.

According to the present invention, there is also provided an optical transmitter comprising signal processing means for performing signal processing of transmission data in accordance with an operation configuration of an optical transmission system, a D/A converter that converts a digital signal processed by the signal processing means into an analog signal, an optical modulator driver circuit that amplifies the signal output from the D/A converter, an optical modulator that modulates continuous light input from a light source by an output signal from the optical modulator driver circuit and outputs the signal, and control signal generation means for generating a first control signal that controls an operation mode of the optical modulator driver circuit based on information about the operation configuration of the optical transmission system.

Effect of the Invention

According to the present invention, a current amount adjustment circuit is provided in the optical modulator driver circuit. This makes it possible to appropriately selectively use the linear operation mode or the limit operation mode in accordance with the operation configuration (modulation format or the presence/absence of transmission end signal processing) of the optical transmission system to which the optical modulator driver circuit according to the present invention is applied and largely reduce power consumption in the limit operation mode. Additionally, in the present invention, since the gain of the amplification means itself can be decreased to zero by decreasing the current amount of the amplification means to zero, a shutdown (no signal output) mode can also be obtained.

According to the optical transmitter of the present invention, the linear operation mode and the limit operation mode of the optical modulator driver circuit can appropriately selectively be used in accordance with the operation configuration of the optical transmission system, and power consumption can be reduced in the limit operation mode. In addition to use in the two modes, that is, the linear operation mode and the limit operation mode, use in an intermediate operation mode between them is also possible. The optical modulator driver circuit can be set in a state optimum for the operation configuration of the optical transmission system.

BRIEF DESCRIPTION OF DRAWINGS

FIG. 42 is a block diagram showing another example of the arrangement of the conventional optical transmitter;

BEST MODE FOR CARRYING OUT THE INVENTION

First Embodiment

Figure 1:
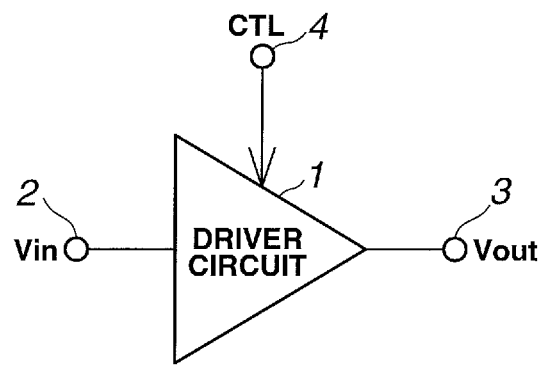
FIG. 1 is a block diagram showing the outline of an optical modulator driver circuit according to the first embodiment of the present invention.
Figure 2:
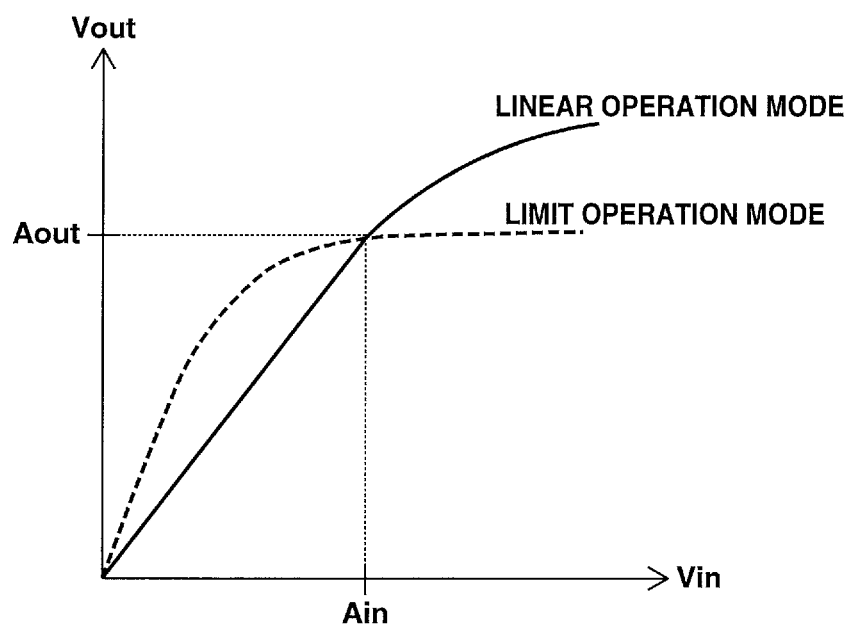
FIG. 2 is a graph showing the input/output characteristic of the optical modulator driver circuit according to the first embodiment of the present invention.

An embodiment of the present invention will now be described with reference to the accompanying drawings. FIG. 1 is a block diagram showing the outline of an optical modulator driver circuit according to this embodiment. FIG. 2 is a graph showing the input/output characteristic of the optical modulator driver circuit according to this embodiment. The abscissa of FIG. 2 represents the amplitude (or input power) of an input signal Vin, and the ordinate represents the amplitude (or output power) of an output signal Vout of the optical modulator driver circuit. The definitions of the abscissa and ordinate also apply to input/output characteristics to be described later.

As a characteristic feature, an optical modulator driver circuit 1 according to this embodiment includes an operation mode switching control terminal 4 in addition to an input terminal 2 and an output terminal 3, and is capable of switching a limit operation mode and a linear operation mode in accordance with the operation configuration (modulation format or the presence/absence of transmission end signal processing).

A signal CTL input to the operation mode switching control terminal 4 is linked with the operation configuration of an optical transmission system to which the optical modulator driver circuit 1 is applied. More specifically, as the signal CTL input to the operation mode switching control terminal 4, a control signal from a DSP may be used, or a signal may manually be set and adjusted. Alternatively, the optical modulator driver circuit 1 may be configured to detect, based on a signal received from outside, the operation configuration of the system to which the driver circuit 1 is applied, and the driver circuit itself may automatically generate the signal CTL to be input to the operation mode switching control terminal 4. In addition, it is preferable to obtain a predetermined desired output amplitude Aout with respect to an assumed input amplitude Ain in both the limit operation mode and the linear operation mode, as shown in FIG. 2, depending on the system requirement.

Figure 3:
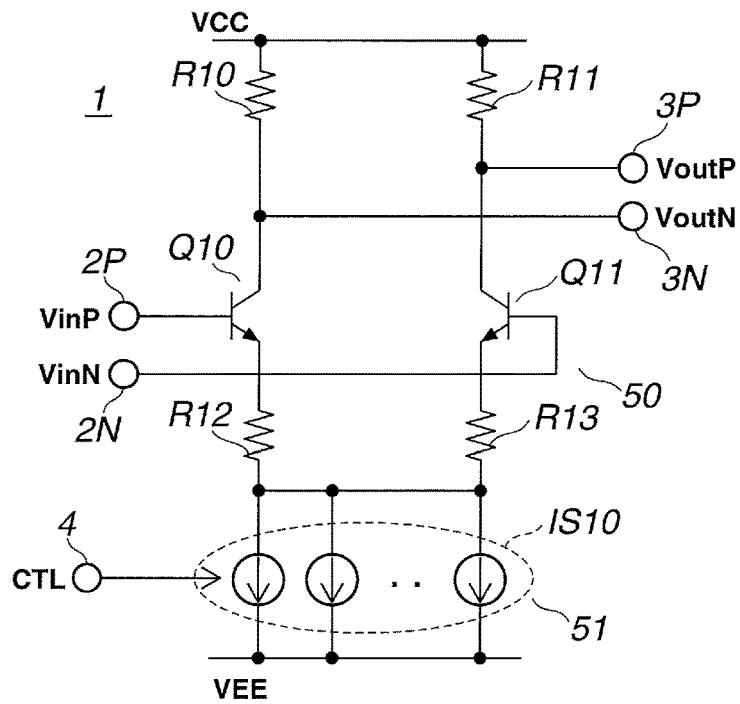
FIG. 3 is a circuit diagram showing an arrangement of the optical modulator driver circuit according to the first embodiment of the present invention.
Figure 4:
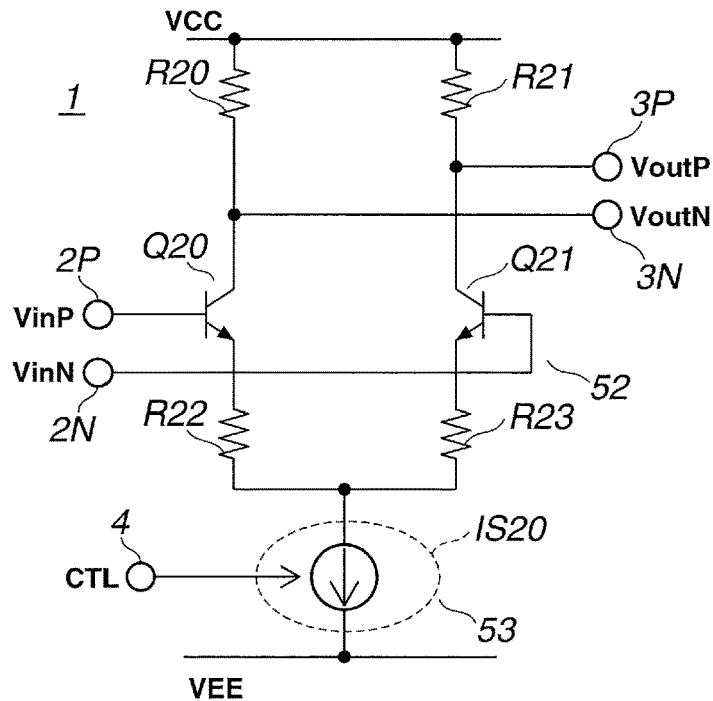
FIG. 4 is a circuit diagram showing another arrangement of the optical modulator driver circuit according to the first embodiment of the present invention.

A circuit configuration method for implementing the optical modulator driver circuit 1 according to this embodiment will be described below. Switching between the low-power/limit operation mode and the linear operation mode can be implemented by adjusting the current amount of the optical modulator driver circuit 1. This can be implemented by circuit configurations shown in FIGS. 3 and 4. Both circuits shown in FIGS. 3 and 4 function as a differential amplifier. The circuit shown in FIG. 3 is characterized by using a plurality of (at least two) current sources capable of ON/OFF-controlling a tail current. The circuit shown in FIG. 4 is characterized by using an arbitrary number of (at least one) variable current sources capable of controlling a tail current.

The optical modulator driver circuit 1 shown in FIG. 3 will be described first. The optical modulator driver circuit 1 shown in FIG. 3 includes a transistor Q10 having a base connected to a positive-phase input terminal 2P and a collector connected to a negative-phase output terminal 3N, a transistor Q11 having a base connected to a negative-phase input terminal 2N and a collector connected to a positive-phase output terminal 3P, a collector resistor R10 having one terminal connected to a power supply voltage VCC and the other terminal connected to the collector of the transistor Q10, a collector resistor R11 having one terminal connected to the power supply voltage VCC and the other terminal connected to the collector of the transistor Q11, an emitter resistor R12 having one terminal connected to the emitter of the transistor Q10, an emitter resistor R13 having one terminal connected to the emitter of the transistor Q11, and a plurality of current sources IS10 each of which has one terminal connected to the other terminal sides of the emitter resistors R12 and R13 and the other terminal connected to a power supply voltage VEE (VCC>VEE), and is ON/OFF-controllable based on the signal CTL input to the operation mode switching control terminal 4. The transistors Q10 and Q11 and the resistors R10 to R13 form a differential amplifier 50. The plurality of current sources IS10 form a current amount adjustment circuit 51. In FIG. 3, VinP is a positive-phase input signal, VinN is a negative-phase input signal, VoutP is a positive-phase output signal, and VoutN is a negative-phase output signal.

In the circuit shown in FIG. 3, the amount of the current flowing through the differential amplifier 50 is controlled using the plurality of parallel current sources IS10 capable of ON/OFF-controlling the tail current of the differential amplifier 50, thereby implementing mode switching of the optical modulator driver circuit 1. When the linear operation of the optical modulator driver circuit 1 is needed, all current sources IS10 are turned on by the control signal CTL input to the operation mode switching control terminal 4 to maximize the tail current amount, thereby enabling an operation in the linear operation mode. When the limit operation of the optical modulator driver circuit 1 is needed, at least one of the plurality of current sources IS10 is turned on, and the rest is turned off by the control signal CTL input to the operation mode switching control terminal 4 to reduce the tail current amount, thereby enabling an operation in the limit operation mode.

Figure 5:
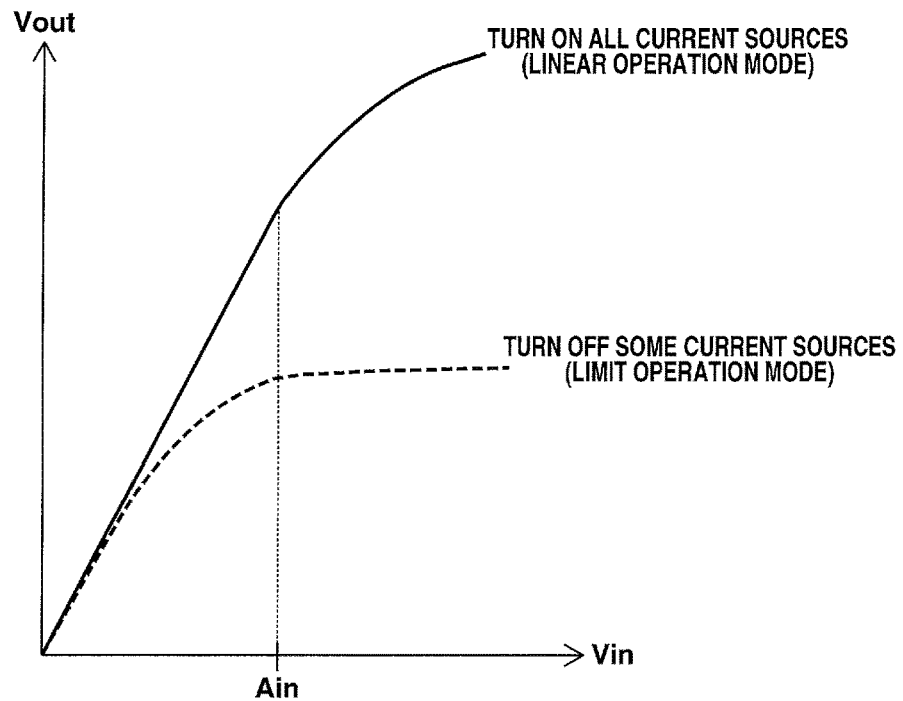
FIG. 5 is a graph showing the input/output characteristic of the optical modulator driver circuit shown in FIG. 3.

FIG. 5 is a graph showing the input/output characteristic of the optical modulator driver circuit 1 shown in FIG. 3. As is apparent from FIG. 5, in the optical modulator driver circuit 1 shown in FIG. 3, the tail current amount of the differential amplifier 50 can be made smaller in the limit operation mode than in the linear operation mode. Power consumption can be reduced accordingly. In addition, the input/output characteristic from the linear operation mode to the limit operation mode can arbitrarily be selected by individually selecting the current sources IS10 to be turned off. It is therefore possible to finely adjust the power consumption and the linearity of the input/output characteristic of the optical modulator driver circuit 1.

The optical modulator driver circuit 1 shown in FIG. 4 will be described next. The optical modulator driver circuit 1 shown in FIG. 4 includes a transistor Q20 having a base connected to the positive-phase input terminal 2P and a collector connected to the negative-phase output terminal 3N, a transistor Q21 having a base connected to the negative-phase input terminal 2N and a collector connected to the positive-phase output terminal 3P, a collector resistor R20 having one terminal connected to the power supply voltage VCC and the other terminal connected to the collector of the transistor Q20, a collector resistor R21 having one terminal connected to the power supply voltage VCC and the other terminal connected to the collector of the transistor Q21, an emitter resistor R22 having one terminal connected to the emitter of the transistor Q20, an emitter resistor R23 having one terminal connected to the emitter of the transistor Q21, and at least one variable current source IS20 which has one terminal connected to the other terminal sides of the emitter resistors R22 and R23 and the other terminal connected to the power supply voltage VEE, and can control the tail current based on the signal CTL input to the operation mode switching control terminal 4. The transistors Q20 and Q21 and the resistors R20 to R23 form a differential amplifier 52. The variable current source IS20 forms a current amount adjustment circuit 53.

The optical modulator driver circuit 1 shown in FIG. 4 is based on the same concept as in FIG. 3, but the control method is different. In the circuit shown in FIG. 4, the amount of the current flowing through the differential amplifier 52 is controlled using the variable current source IS20 capable of controlling the tail current of the differential amplifier 52, thereby implementing mode switching of the optical modulator driver circuit 1.

Figure 6:
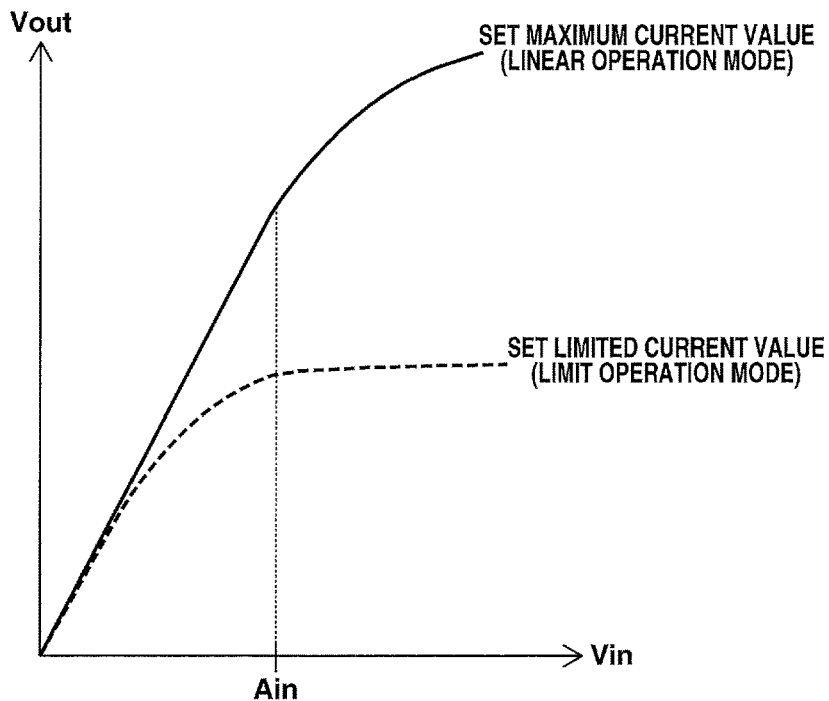
FIG. 6 is a graph showing the input/output characteristic of the optical modulator driver circuit shown in FIG. 4.

FIG. 6 is a graph showing the input/output characteristic of the optical modulator driver circuit 1 shown in FIG. 4. As shown in FIG. 6, when the linear operation of the optical modulator driver circuit 1 is needed, the current amount is set large (to the maximum value) by the control signal CTL input to the operation mode switching control terminal 4, thereby enabling an operation in the linear operation mode. When the limit operation of the optical modulator driver circuit 1 is needed, the current amount is reduced by the control signal CTL input to the operation mode switching control terminal 4, thereby enabling an operation in the limit operation mode. When this control method is employed, the linearity and power consumption can finely be adjusted not by stepwise control as in the circuit shown in FIG. 3 but by analog (continuous) control. Note that the amount of the current capable of flowing to one variable current source IS20 is limited. Hence, the number of variable current sources IS20 is determined in accordance with the necessary current amount, and the variable current sources IS20 are connected in parallel.

FIGS. 3 and 4 show examples in which bipolar transistors are used as the transistors Q10, Q11, Q20, and Q21. However, the transistor is not limited to a bipolar transistor, and an FET-based transistor such as a CMOS may be used. If an FET-based transistor is used, the base in the above description is replaced with a gate, the collector is replaced with a drain, and the emitter is replaced with a source.

As described above, when the circuit shown in FIG. 3 or 4 is used, the linear operation mode and the limit operation mode of the optical modulator driver circuit can be switched. In the limit operation mode, the power consumption can be reduced according to a decrease in the tail current. Additionally, in the circuits shown in FIGS. 3 and 4, the maximum gain can be obtained in the linear operation mode in which the tail current amount of the differential amplifier is maximized. The gain decreases as the tail current amount is reduced. When the tail current is reduced to zero, the gain itself can be reduced to zero. Hence, the circuit can be used even in a shutdown (no signal output) mode. In other words, the optical modulator driver circuit 1 according to this embodiment has a gain changing function as well.

Second Embodiment

In the first embodiment, the circuit exhibits a behavior that maximizes the gain in the linear operation mode and reduces the gain in the limit operation mode. Hence, the output amplitude level with respect to the assumed input amplitude Ain changes depending on the operation mode, as described above. In a case where such a behavior is permitted in the system, if, for example, the output amplitude from the DAC, that is, the input amplitude to the optical modulator driver circuit can arbitrarily be adjusted on the DSP side in accordance with the operation state (modulation format or the presence/absence of transmission end signal processing), the circuit according to the first embodiment can directly be used as the optical modulator driver circuit without any problem. However, considering a simple operation, the optical modulator driver circuit preferably obtains the predetermined desired output amplitude Aout with respect to the assumed input amplitude Ain in both the linear operation mode and the limit operation mode.

This embodiment proposes a circuit configuration capable of obtaining a predetermined desired output amplitude Aout with respect to an assumed input amplitude Ain in both the linear operation mode and the limit operation mode. More specifically, the circuit shown in FIG. 3 or 4 is used as an output circuit, and a linear variable gain circuit is added to the preceding stage, thereby forming a driver circuit having a two-stage structure.

Figure 7:
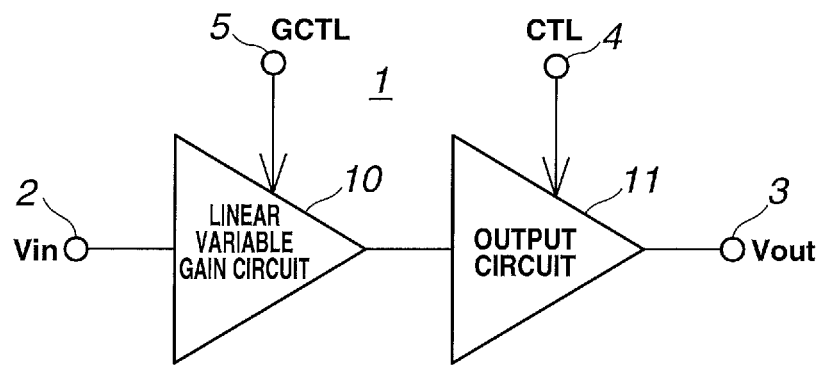
FIG. 7 is a block diagram showing an arrangement of an optical modulator driver circuit according to the second embodiment of the present invention.
Figure 8:
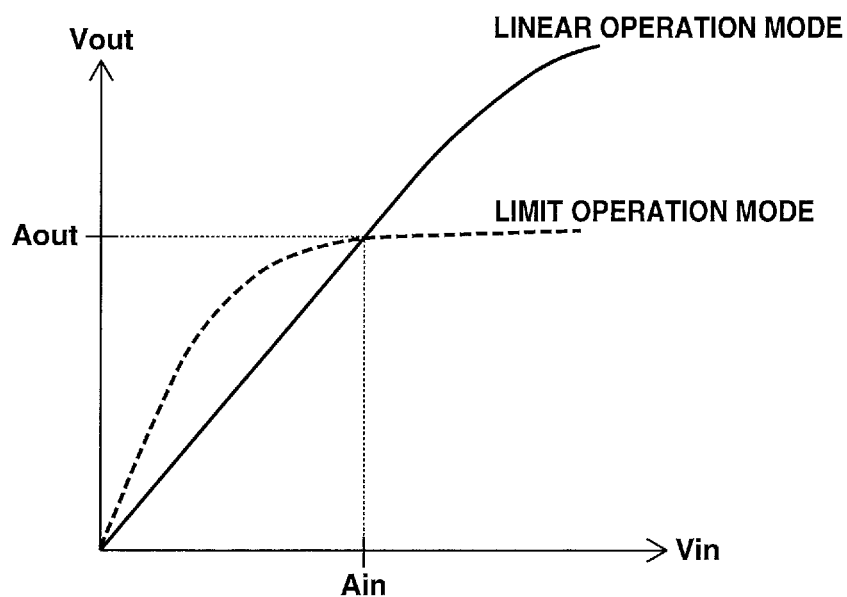
FIG. 8 is a graph showing the input/output characteristic of the optical modulator driver circuit shown in FIG. 7.

FIG. 7 is a block diagram showing an arrangement of an optical modulator driver circuit 1 according to this embodiment. FIG. 8 is a graph showing the input/output characteristic of the optical modulator driver circuit 1 shown in FIG. 7. In the optical modulator driver circuit 1 according to this embodiment, the circuit shown in FIG. 3 or 4 is used as an output circuit 11, and a linear variable gain circuit 10 having an output terminal connected to the input terminal of the output circuit 11 is added to the preceding stage. The linear variable gain circuit 10 is a circuit capable of adjusting the gain in accordance with a gain control signal GCTL input to a gain control terminal 5.

As shown in FIG. 8, the linear variable gain circuit 10 decreases the gain in the linear operation mode, and increases it in the limit operation mode. This can implement a circuit capable of obtaining the predetermined desired output amplitude Aout with respect to the assumed input amplitude Ain. Applying the circuit shown in FIG. 3 or 4 as the output circuit 11 that needs to ensure a large amplitude to a fixed load system (50Ω in the assumed application) and most consumes power is most effective to reduce power consumption in the limit operation mode.

Figure 9:
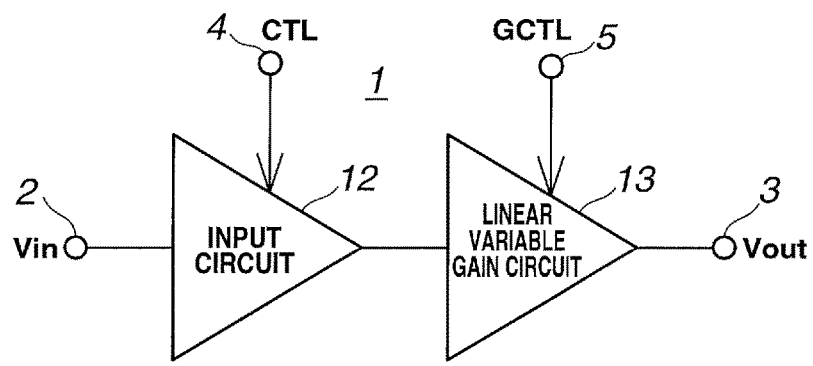
FIG. 9 is a block diagram showing another arrangement of the optical modulator driver circuit according to the second embodiment of the present invention.
Figure 10:
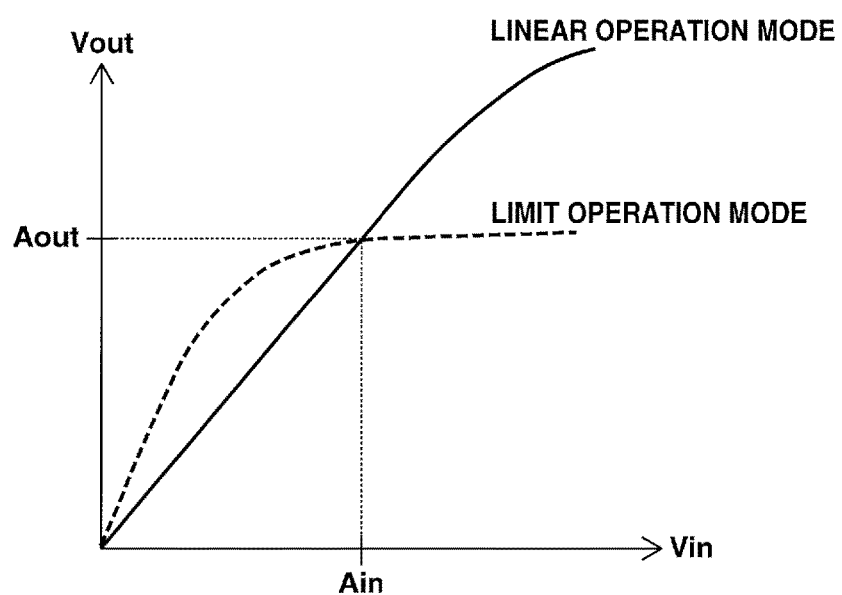
FIG. 10 is a graph showing the input/output characteristic of the optical modulator driver circuit shown in FIG. 9.

FIG. 9 is a block diagram showing another arrangement of the optical modulator driver circuit 1 according to this embodiment. FIG. 10 is a graph showing the input/output characteristic of the optical modulator driver circuit 1 shown in FIG. 9. In the optical modulator driver circuit 1 shown in FIG. 9, the circuit shown in FIG. 3 or 4 is used as an input circuit 12, and a linear variable gain circuit 13 having an input terminal connected to the output terminal of the input circuit 12 is added to the subsequent stage. This can implement the mode switching function, like the arrangement shown in FIG. 7.

In the arrangement shown in FIG. 9 as well, as shown in FIG. 10, the linear variable gain circuit 13 decreases the gain in the linear operation mode, and increases it in the limit operation mode, thereby obtaining the predetermined desired output amplitude Aout with respect to the assumed input amplitude Ain.

Figure 11:
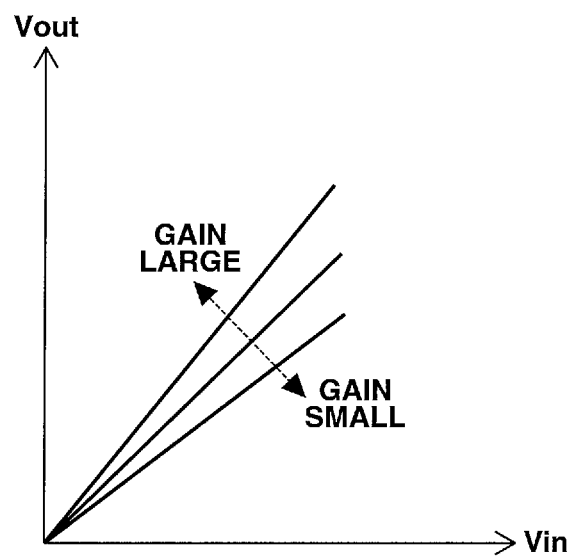
FIG. 11 is a graph showing the input/output characteristic of a linear variable gain circuit according to the second embodiment of the present invention.

A circuit having a linear variable gain characteristic as shown in FIG. 11 solely is assumed as the linear variable gain circuits 10 and 13 shown in FIGS. 7 and 9. When the linear variable gain circuit 10 or 13 is added, gain change and amplitude adjustment in a wide range can be performed in each of the linear operation mode and the limit operation mode. Hence, the driving amplitude of the optical modulator of the subsequent stage can also be optimized. As the signal GCTL input to the gain control terminal 5, a control signal from a DSP may be used, or a signal may manually be set and adjusted. Alternatively, the optical modulator driver circuit 1 may be configured to detect, based on a signal received from outside, the operation configuration of the system to which the driver circuit 1 is applied, and the driver circuit itself may automatically generate the signal GCTL to be input to the gain control terminal 5.

Figure 12:
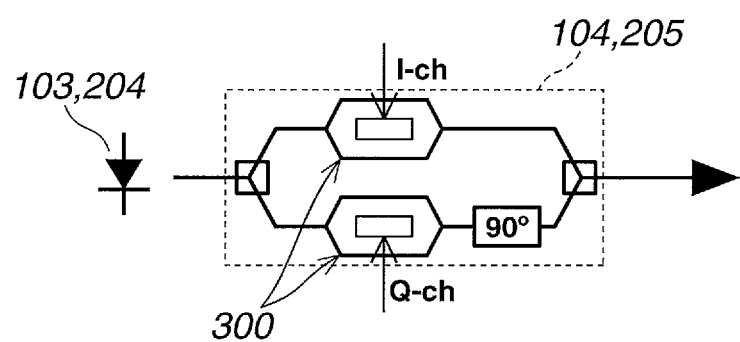
FIG. 12 is a circuit diagram showing the arrangement of an optical I/Q modulator.
Figure 13:
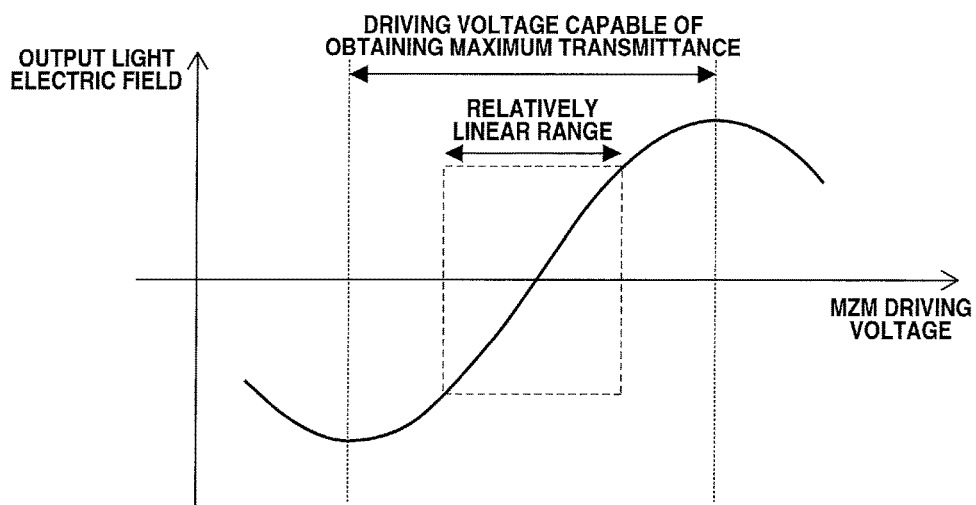
FIG. 13 is a graph showing the input/output characteristic of an MZ modulator used in the optical I/Q modulator shown in FIG. 12.
Figure 14:
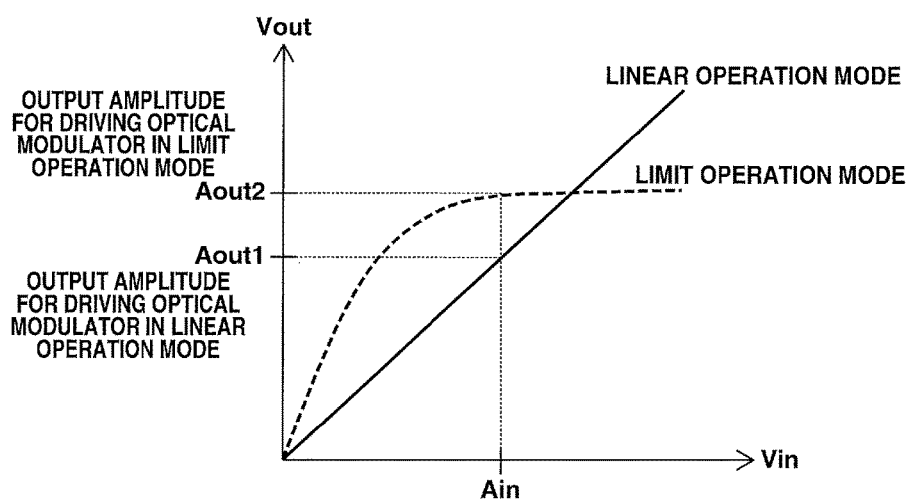
FIG. 14 is a graph for explaining a conventional method of compensating for the nonlinearity of the MZ modulator.
Figure 40:
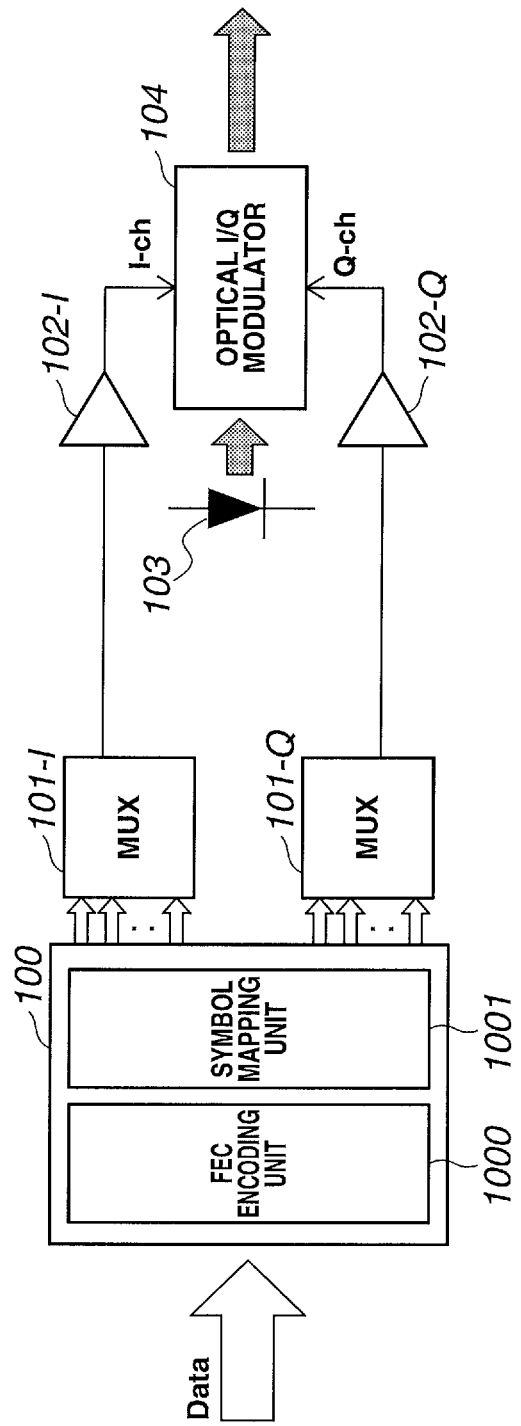
FIG. 40 is a block diagram showing an example of the arrangement of a conventional optical transmitter.
Figure 41A:
FIG. 41A is a view showing the output signal of a multiplex shown in FIG. 40.
Figure 41B:
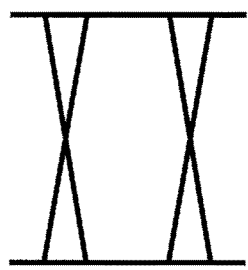
FIG. 41B is a view showing the output signal of an optical modulator driver circuit shown in FIG. 40.
Figure 41C:
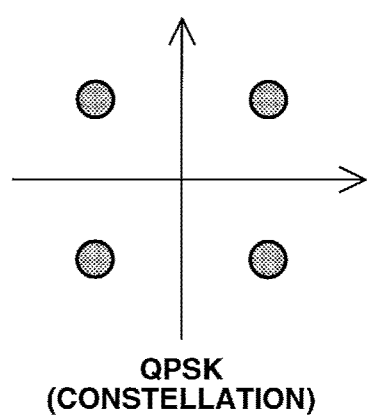
FIG. 41C is a constellation diagram showing, on a plane, the optical output signal of an optical I/Q modulator shown in FIG. 40.
Figure 43A:
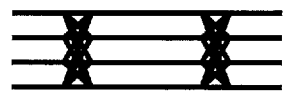
FIG. 43A is a view showing the output signal of a D/A converter shown in FIG. 42.
Figure 43B:
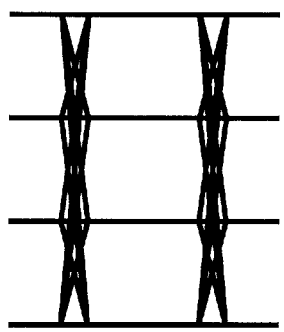
FIG. 43B is a view showing the output signal of an optical modulator driver circuit shown in FIG. 42.
Figure 43C:
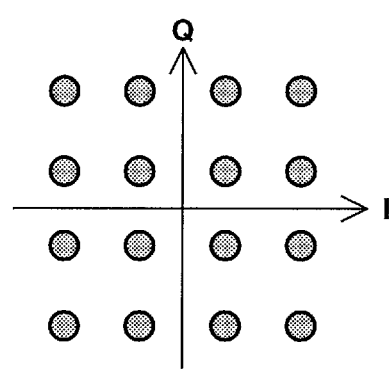
FIG. 43C is a constellation diagram showing, on a plane, the optical output signal of an optical I/Q modulator shown in FIG. 42.
Figure 44A:
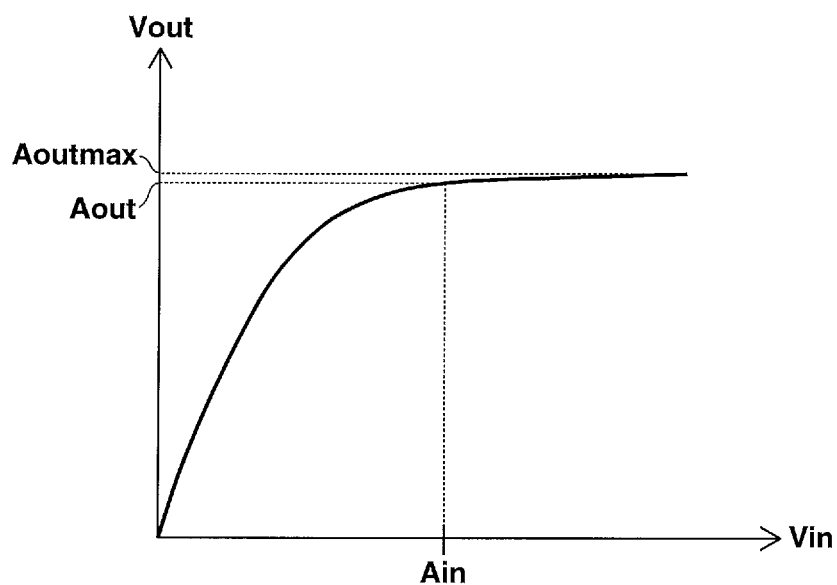
FIG. 44A is a graph showing the input/output characteristic of a limit type driver circuit.
Figure 44B:
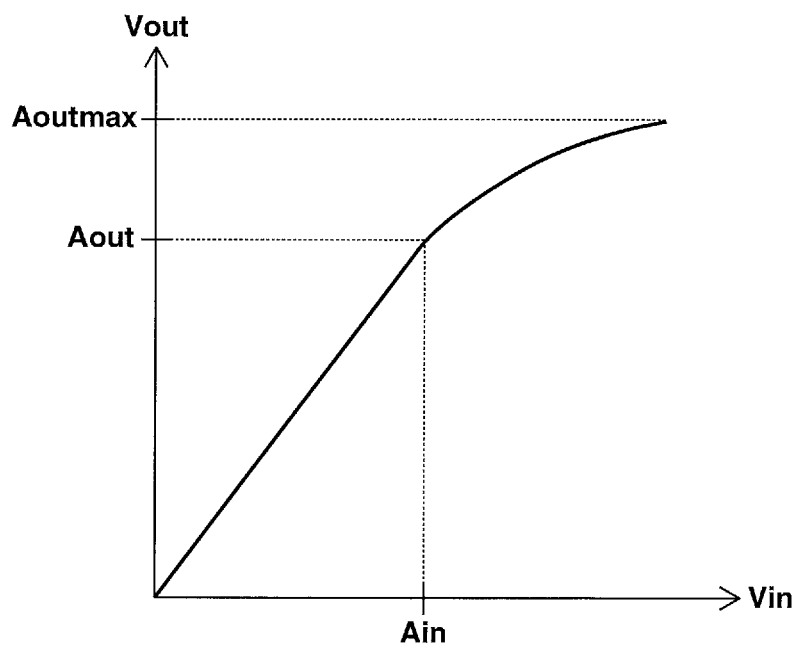
FIG. 44B is a graph showing the input/output characteristic of a linear driver circuit.

Each of optical I/Q modulators 104 and 205 shown in FIGS. 40 and 42 to be driven by the optical modulator driver circuit 1 is formed from an MZ (Mach-Zehnder) modulator 300, as shown in FIG. 12. The MZ modulator 300 has a nonlinear input/output characteristic, which generally exhibits a sine (sinusoidal) curve, as shown in FIG. 13. In an operation configuration in which the pre-equalization unit of the DSP does not compensate for the nonlinearity of the MZ modulator 300, it is considerable to use a method of intentionally making the driving amplitude small to drive the circuit in the linear operation range in the linear operation mode, as shown in FIG. 14. However, when the optical modulator driver circuit 1 according to this embodiment shown in FIG. 7 or 9 is used, gain change and amplitude adjustment can be performed in each of the linear operation mode and the limit operation mode. It is therefore possible to compensate for the nonlinearity of the MZ modulator.

Third Embodiment

Figure 15:
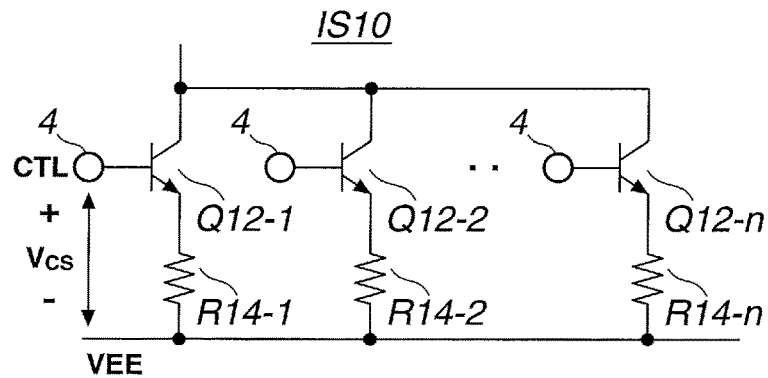
FIG. 15 is a circuit diagram showing the arrangement of the current source of the optical modulator driver circuit shown in FIG. 3.
Figure 16:
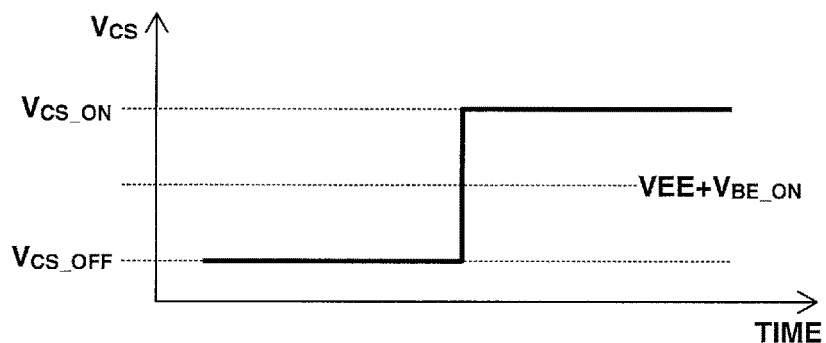
FIG. 16 is a timing chart for explaining a method of controlling the current source shown in FIG. 15.

The detailed arrangement and the control method of the current source of the optical modulator driver circuit 1 according to the third embodiment will be described next. FIG. 15 is a circuit diagram showing the arrangement of a current source IS10 of the optical modulator driver 1 shown in FIG. 3. FIG. 16 is a timing chart for explaining a method of controlling the current source IS10. Each of n (n is an integer of 2 or more) current sources IS10 includes a current source transistor Q12 (Q12-1 to Q12-$n$) having a base connected to an operation mode switching control terminal 4 and a collector connected to the other terminal sides of emitter resistors R12 and R13 shown in FIG. 3, and a resistor R14 (R14-1 to R14-$n$) having one terminal connected to the emitter of the current source transistor Q12 and the other terminal connected to a power supply voltage VEE.

In the arrangement shown in FIG. 15, the current source transistor Q12 is controlled by a control signal $V_{CS}$ (CTL shown in FIG. 3) input to the operation mode switching control terminal 4 to switch the current amount of the current source IS10, thereby implementing operation mode switching of the optical modulator driver circuit 1. The control signal $V_{CS}$ is a binary signal that turns on/off the current source transistor Q12, as shown in FIG. 16. To turn off the current source transistor Q12, a voltage $V_{CS\_OFF}$ ($V_{CS\_OFF} \approx$ VEE) close to the power supply voltage VEE is given as the control signal $V_{CS}$. To turn on the current source transistor Q12, a voltage $V_{CS\_ON}$ ($V_{CS\_ON}$>VEE+$V_{BE\_ON}$) higher than the sum (VEE+$V_{BE\_ON}$) of the power supply voltage VEE and an ON voltage $V_{BE\_ON}$ of the current source transistor Q12 is given as the control signal $V_{CS}$.

Each current source transistor Q12 may individually receive the control signal $V_{CS}$. That is, the control signals $V_{CS}$ as many as the number of current source transistors Q12 may be prepared. When all current source transistors Q12 are turned on, the optical modulator driver circuit 1 shown in FIG. 3 operates in the linear operation mode. When at least one of the plurality of current source transistors Q12 is turned on, and the rest is turned off, the optical modulator driver circuit 1 shown in FIG. 3 operates in the limit operation mode. Note that the current source transistors Q12 may be controlled by the single control signal $V_{CS}$.

Figure 17:
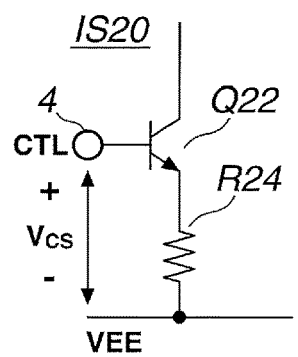
FIG. 17 is a circuit diagram showing the arrangement of the current source of the optical modulator driver circuit shown in FIG. 4.
Figure 18:
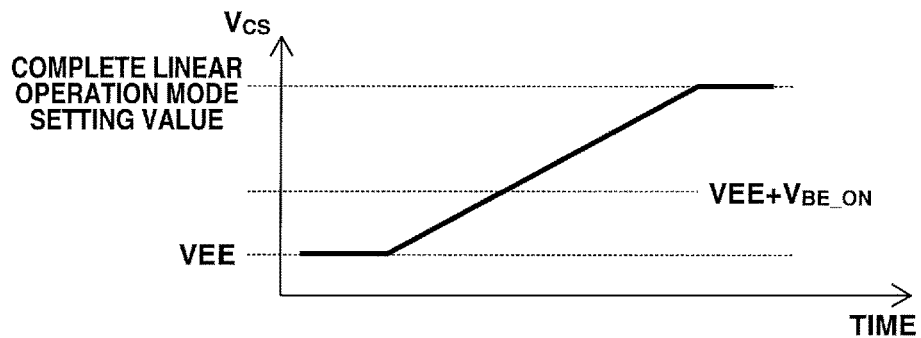
FIG. 18 is a timing chart for explaining a method of controlling the current source shown in FIG. 17.

FIG. 17 is a circuit diagram showing the arrangement of a current source IS20 of the optical modulator driver 1 shown in FIG. 4. FIG. 18 is a timing chart for explaining a method of controlling the current source IS20. The current source IS20 includes a current source transistor Q22 having a base connected to the operation mode switching control terminal 4 and a collector connected to the other terminal sides of emitter resistors R22 and R23 shown in FIG. 4, and a resistor R24 having one terminal connected to the emitter of the current source transistor Q22 and the other terminal connected to the power supply voltage VEE.

The arrangement of the current source itself is the same as in FIG. 15, but the control method is different. Since the current source IS20 shown in FIG. 17 is used as a variable current source, not a binary control signal as shown in FIG. 16 but the continuous control signal $V_{CS}$ (CTL shown in FIG. 4) as shown in FIG. 18 is used. When the continuous control signal $V_{CS}$ is used, the input/output characteristic of the optical modulator driver circuit 1 shown in FIG. 4 can continuously be changed from the linear operation mode to the limit operation mode.

FIG. 17 shows an arrangement example using one current source transistor Q22. However, a plurality of arrangements shown in FIG. 17 may be connected in parallel, and the current source transistors Q22 may be controlled by the common control signal $V_{CS}$ or different control signals $V_{CS}$.

In the arrangements shown in FIGS. 15 and 17, the control signal $V_{CS}$ may directly be applied from outside to the current source transistors Q12 and Q22 or applied via a voltage conversion circuit (for example, voltage level shift circuit) in accordance with the interface to the control side.

FIGS. 15 and 17 show examples in which bipolar transistors are used as the current source transistors Q12 and Q22. However, an FET-based transistor may be used. If an FET-based transistor is used, the base is replaced with a gate, the collector is replaced with a drain, and the emitter is replaced with a source.

In the first to third embodiments, the optical modulator driver circuit is formed as a circuit having a one- or two-stage structure. However, an amplification circuit that linearly responds may appropriately be added in accordance with the necessary gain. When the optical modulator driver circuit has a multi-stage structure, the functions may be integrated on one chip, or a multichip circuit may be formed.

Fourth Embodiment

Figure 19:
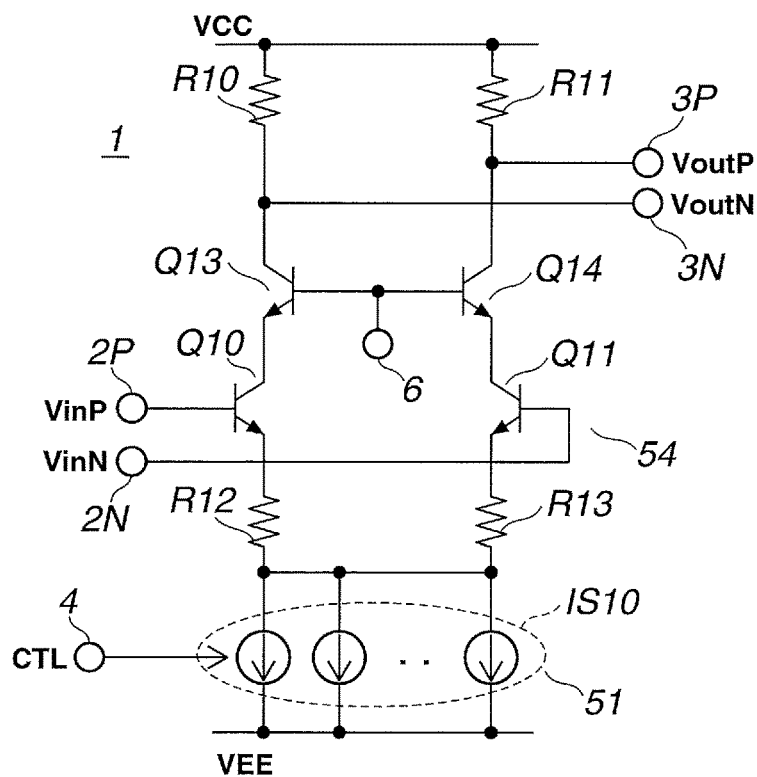
FIG. 19 is a circuit diagram showing an arrangement of an optical modulator driver circuit according to the fourth embodiment of the present invention.

In the first embodiment, the optical modulator driver circuit has been described as a simple amplifier. However, the optical modulator driver circuit may have a cascode structure for the purpose of improving the band or reducing reflection. FIG. 19 is a circuit diagram showing an arrangement of an optical modulator driver circuit 1 according to this embodiment. In the optical modulator driver circuit 1 shown in FIG. 19, a transistor Q13 having a base connected to a bias terminal 6, a collector connected to a negative-phase output terminal 3N, and an emitter connected to the collector of a transistor Q10 and a transistor Q14 having a base connected to the bias terminal 6, a collector connected to a positive-phase output terminal 3P, and an emitter connected to the collector of a transistor Q11 are added to the circuit shown in FIG. 3. The transistors Q10, Q11, Q13, and Q14 and resistors R10 to R13 form a differential amplifier 54. A predetermined bias voltage is applied to the bias terminal 6.

Figure 20:
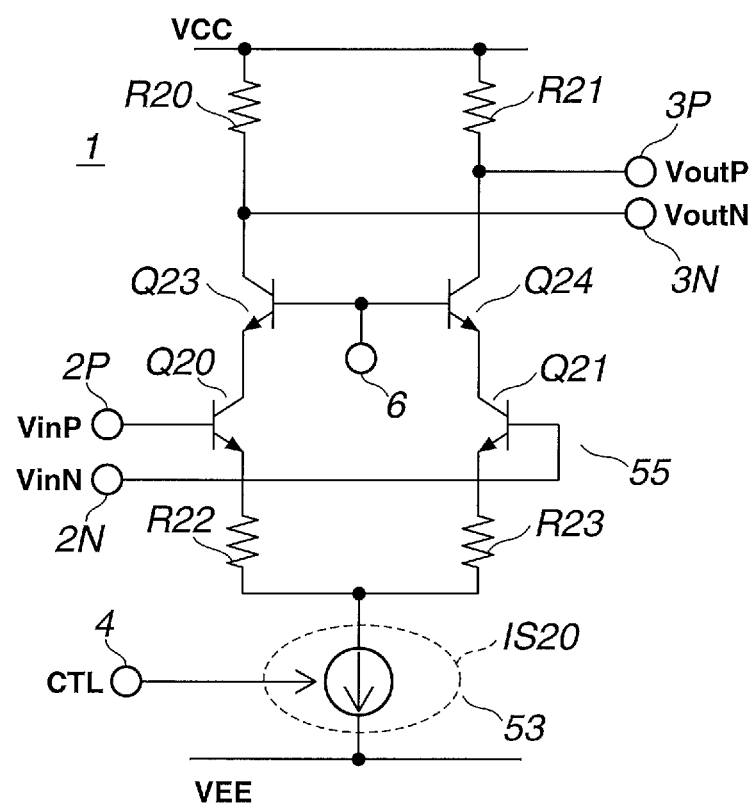
FIG. 20 is a circuit diagram showing another arrangement of the optical modulator driver circuit according to the fourth embodiment of the present invention.

FIG. 20 is a circuit diagram showing another arrangement of the optical modulator driver circuit 1 according to this embodiment. In the optical modulator driver circuit 1 shown in FIG. 20, a transistor Q23 having a base connected to the bias terminal 6, a collector connected to the negative-phase output terminal 3N, and an emitter connected to the collector of a transistor Q20 and a transistor Q24 having a base connected to the bias terminal 6, a collector connected to the positive-phase output terminal 3P, and an emitter connected to the collector of a transistor Q21 are added to the circuit shown in FIG. 4. The transistors Q20, Q21, Q23, and Q24 and resistors R20 to R23 form a differential amplifier 55.

When the cascode transistors Q13, Q14, Q23, and Q24 are added, as in this embodiment, the mirror effect can be reduced, and the impedance of the optical modulator driver circuit viewed from the collector side can be increased. It is therefore possible to improve the band and the reflection characteristic.

Fifth Embodiment

Figure 21:
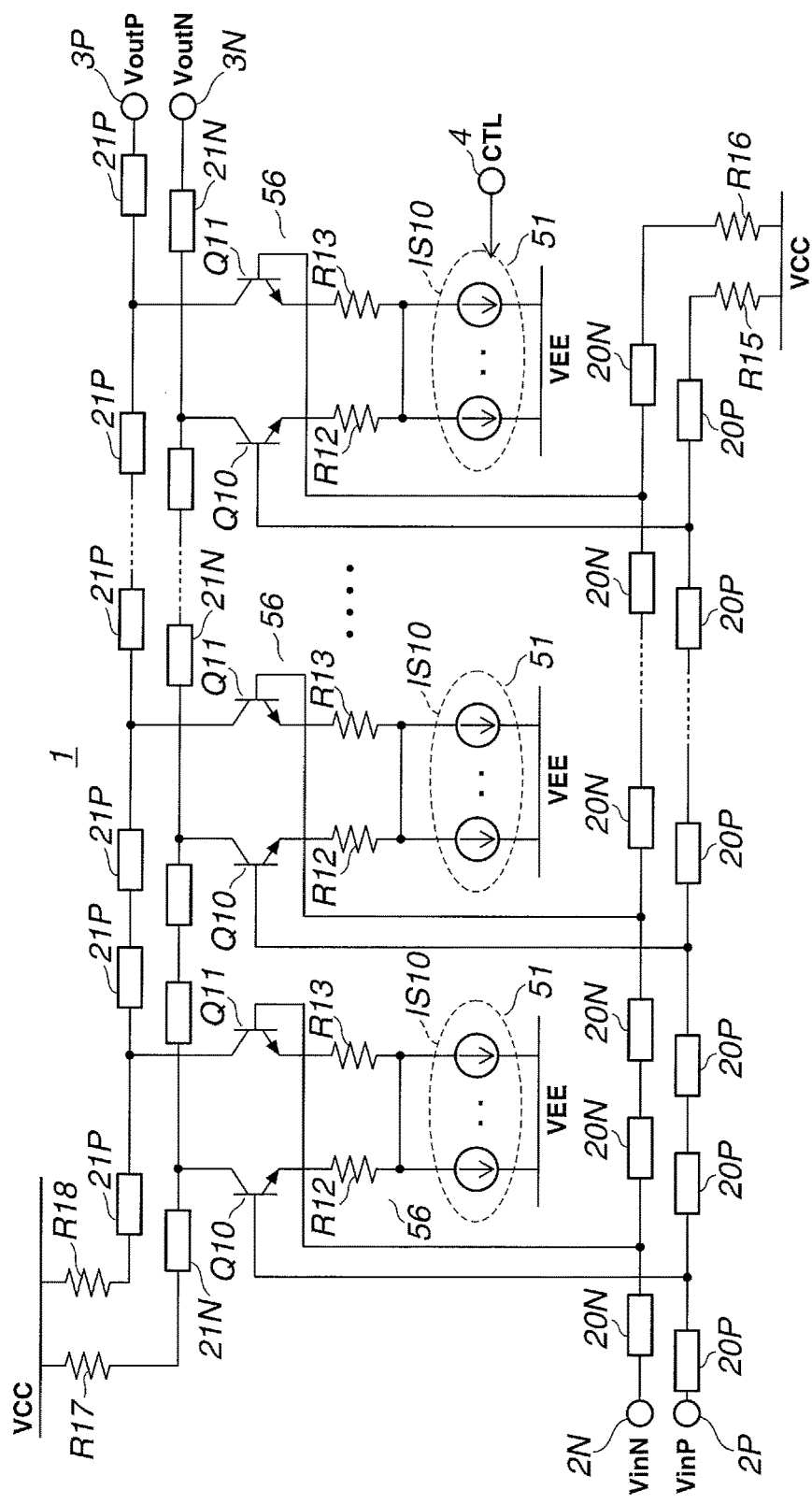
FIG. 21 is a circuit diagram showing an arrangement of an optical modulator driver circuit according to the fifth embodiment of the present invention.

The circuit described in the first or fourth embodiment may be formed as a lumped constant circuit or a distributed constant circuit. FIG. 21 is a circuit diagram showing an arrangement of an optical modulator driver circuit 1 according to this embodiment. The same reference numerals as in FIG. 3 denote the same parts in FIG. 21. The optical modulator driver circuit 1 shown in FIG. 21 includes a differential amplifier 56 formed from transistors Q10 and Q11 and resistors R12 and R13, a current amount adjustment circuit 51 formed from a current source IS10, an input transmission line 20P having an input end connected to a positive-phase input terminal 2P, an input transmission line 20N having an input end connected to a negative-phase input terminal 2N, an output transmission line 21P having an output end connected to a positive-phase output terminal 3P, an output transmission line 21N having an output end connected to a negative-phase output terminal 3N, a resistor R15 having one terminal connected to the output end of the input transmission line 20P and the other terminal connected to a power supply voltage VCC, a resistor R16 having one terminal connected to the output end of the input transmission line 20N and the other terminal connected to the power supply voltage VCC, a resistor R17 having one terminal connected to the input end of the output transmission line 21P and the other terminal connected to the power supply voltage VCC, and a resistor R18 having one terminal connected to the input end of the output transmission line 21N and the other terminal connected to the power supply voltage VCC.

Each differential amplifier 56 shown in FIG. 21 is arranged along the input transmission lines 20P and 20N and the output transmission lines 21P and 21N. The base of the transistor Q10 is connected to the input transmission line 20P, the base of the transistor Q11 is connected to the input transmission line 20N, the collector of the transistor Q10 is connected to the output transmission line 21N, and the collector of the transistor Q11 is connected to the output transmission line 21P.

Figure 22:
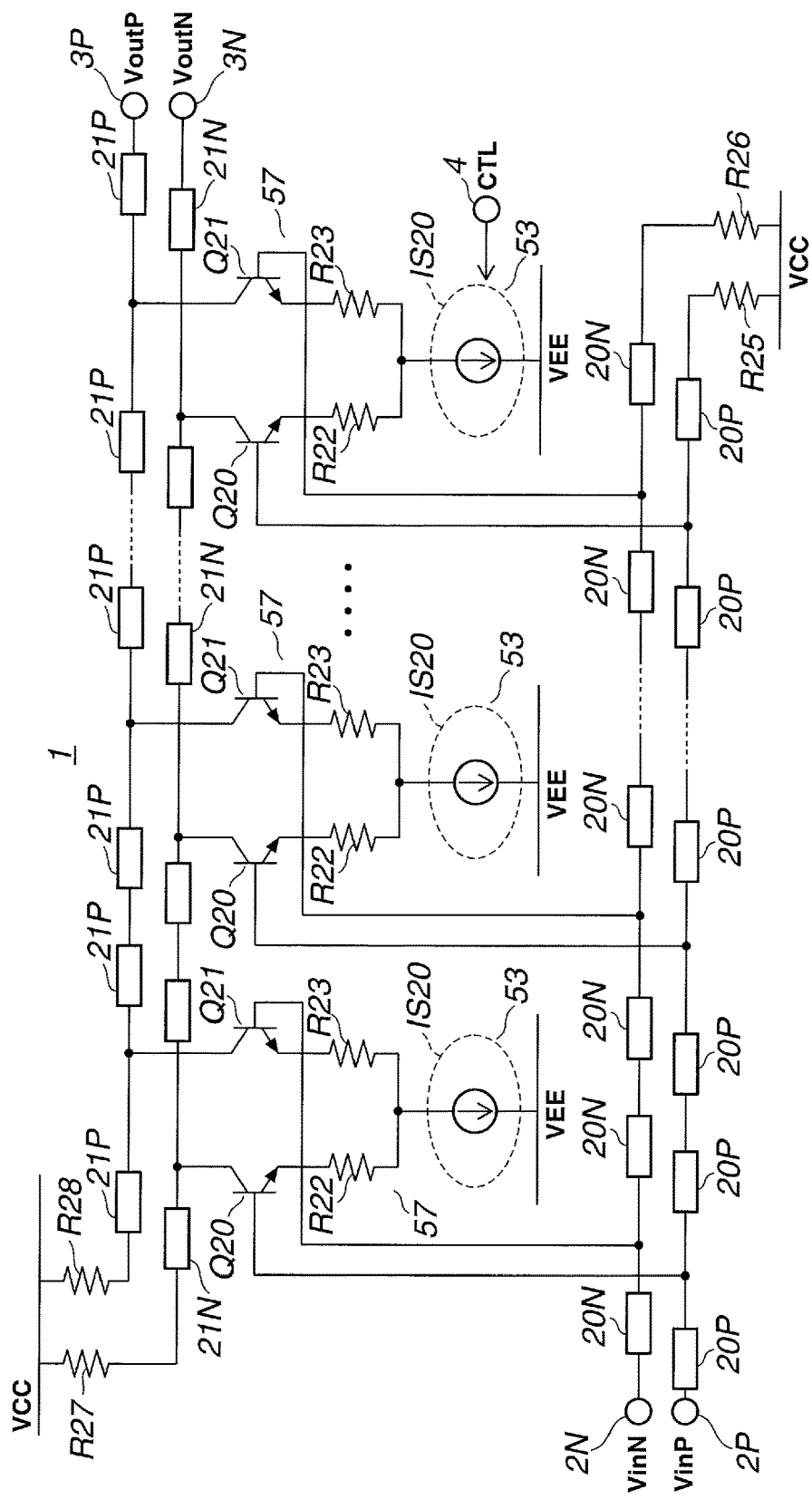
FIG. 22 is a circuit diagram showing another arrangement of the optical modulator driver circuit according to the fifth embodiment of the present invention.

FIG. 22 is a circuit diagram showing another arrangement of the optical modulator driver circuit 1 according to this embodiment. The same reference numerals as in FIG. 4 denote the same parts in FIG. 22. The optical modulator driver circuit 1 shown in FIG. 22 includes a differential amplifier 57 formed from transistors Q20 and Q21 and resistors R22 and R23, a current amount adjustment circuit 53 formed from a current source IS20, the input transmission lines 20P and 20N, the output transmission lined 21P and 21N, a resistor R25 having one terminal connected to the output end of the input transmission line 20P and the other terminal connected to the power supply voltage VCC, a resistor R26 having one terminal connected to the output end of the input transmission line 20N and the other terminal connected to the power supply voltage VCC, a resistor R27 having one terminal connected to the input end of the output transmission line 21P and the other terminal connected to the power supply voltage VCC, and a resistor R28 having one terminal connected to the input end of the output transmission line 21N and the other terminal connected to the power supply voltage VCC.

Each differential amplifier 57 shown in FIG. 22 is arranged along the input transmission lines 20P and 20N and the output transmission lines 21P and 21N. The base of the transistor Q20 is connected to the input transmission line 20P, the base of the transistor Q21 is connected to the input transmission line 20N, the collector of the transistor Q20 is connected to the output transmission line 21N, and the collector of the transistor Q21 is connected to the output transmission line 21P.

The operations of the differential amplifiers 56 and 57 shown in FIGS. 21 and 22 are the same as those of the differential amplifiers 50 and 52 described in the first embodiment. Note that the differential amplifiers 56 and 57 shown in FIGS. 21 and 22 may have a cascode structure as described in the fourth embodiment.

Sixth Embodiment

Figure 23:
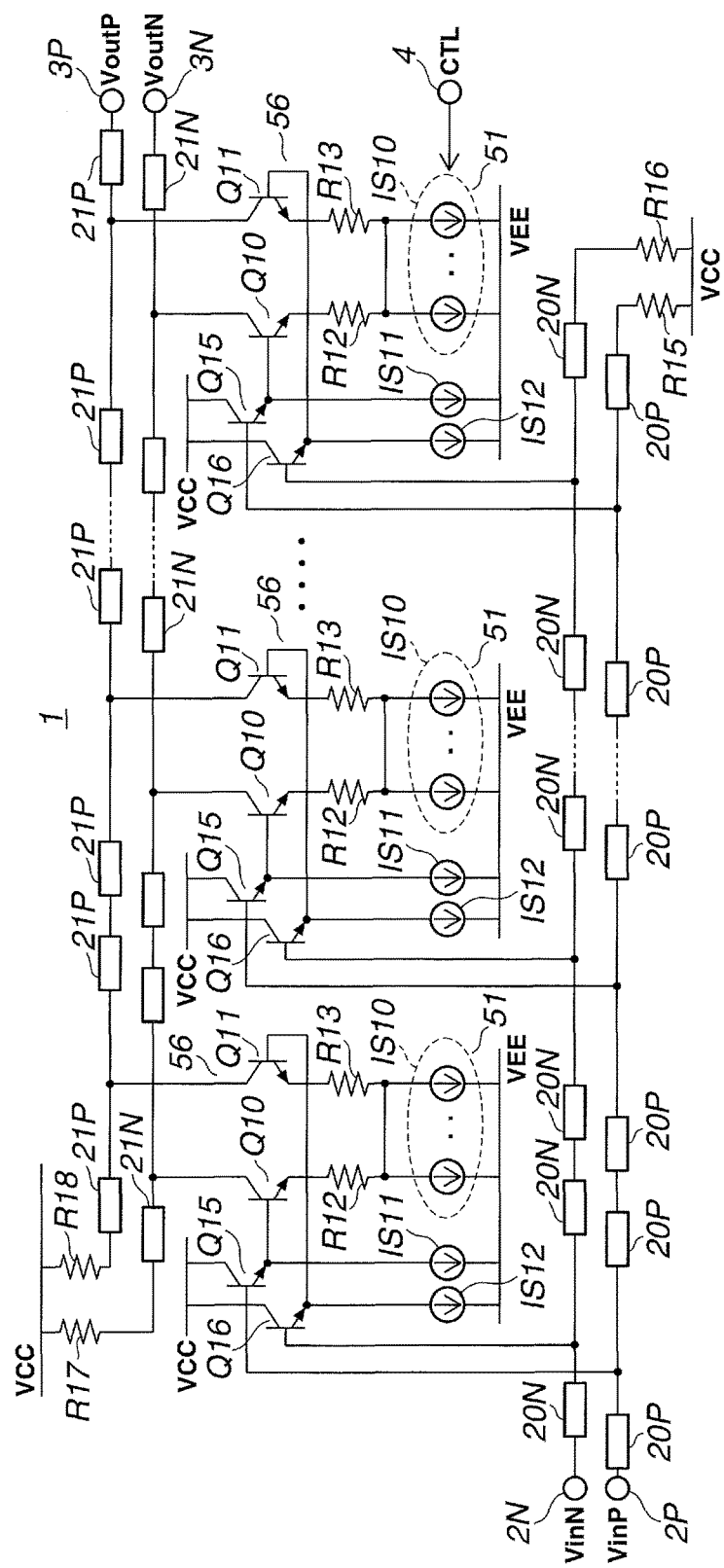
FIG. 23 is a circuit diagram showing an arrangement of an optical modulator driver circuit according to the sixth embodiment of the present invention.

FIG. 23 is a circuit diagram showing an arrangement of an optical modulator driver circuit 1 according to this embodiment. The same reference numerals as in FIGS. 3 and 21 denote the same parts in FIG. 23. In the optical modulator driver circuit 1 shown in FIG. 23, an emitter follower circuit is added to the input portion of each differential amplifier 56 in the optical modulator driver circuit shown in FIG. 21.

An emitter follower circuit on the positive side shown in FIG. 23 includes a transistor Q15 having a base connected to an input transmission line 20P, a collector connected to a power supply voltage VCC, and an emitter connected to the base of a transistor Q10, and a current source IS11 having one terminal connected to the emitter of the transistor Q15 and the other terminal connected to a power supply voltage VEE.

An emitter follower circuit on the negative side shown in FIG. 23 includes a transistor Q16 having a base connected to an input transmission line 20N, a collector connected to the power supply voltage VCC, and an emitter connected to the base of a transistor Q11, and a current source IS12 having one terminal connected to the emitter of the transistor Q16 and the other terminal connected to the power supply voltage VEE.

Figure 24:
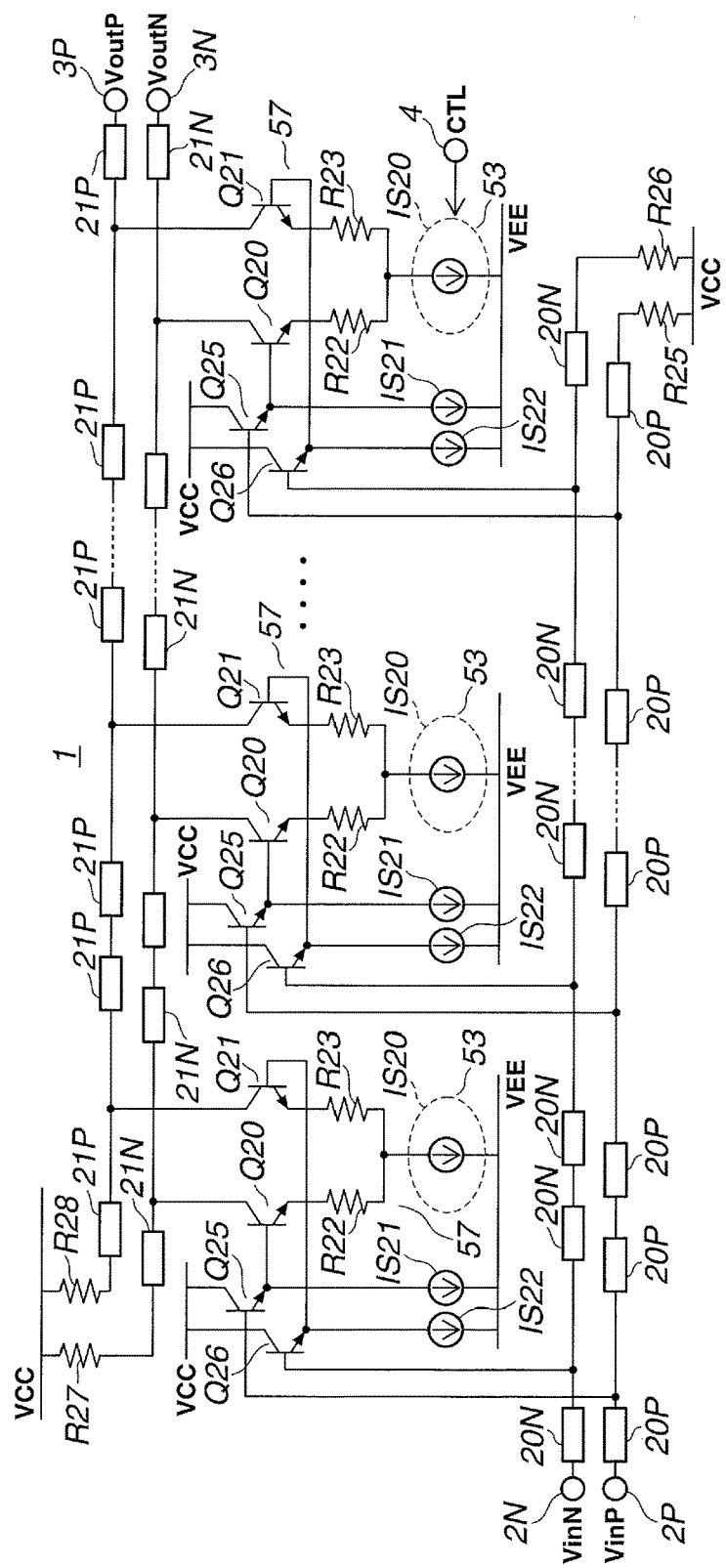
FIG. 24 is a circuit diagram showing another arrangement of the optical modulator driver circuit according to the sixth embodiment of the present invention.

FIG. 24 is a circuit diagram showing another arrangement of the optical modulator driver circuit 1 according to this embodiment. The same reference numerals as in FIGS. 4 and 22 denote the same parts in FIG. 24. In the optical modulator driver circuit 1 shown in FIG. 24, an emitter follower circuit is added to the input portion of each differential amplifier 57 in the optical modulator driver circuit shown in FIG. 22.

An emitter follower circuit on the positive side shown in FIG. 24 includes a transistor Q25 having a base connected to the input transmission line 20P, a collector connected to the power supply voltage VCC, and an emitter connected to the base of a transistor Q20, and a current source IS21 having one terminal connected to the emitter of the transistor Q25 and the other terminal connected to the power supply voltage VEE.

An emitter follower circuit on the negative side shown in FIG. 24 includes a transistor Q26 having a base connected to the input transmission line 20N, a collector connected to the power supply voltage VCC, and an emitter connected to the base of a transistor Q21, and a current source IS22 having one terminal connected to the emitter of the transistor Q26 and the other terminal connected to the power supply voltage VEE.

As described above, in this embodiment, an emitter follower circuit is added to the input portion of each of the differential amplifiers 56 and 57 of the distribution stage. This makes it possible to increase the impedance of the input and improve matching of the input portion and also optimize the input bias point of each stage.

The operations of the differential amplifiers 56 and 57 shown in FIGS. 23 and 24 are the same as those of the differential amplifiers 50 and 52 described in the first embodiment. Note that the differential amplifiers 56 and 57 shown in FIGS. 23 and 24 may have a cascode structure as described in the fourth embodiment.

Seventh Embodiment

Figure 25:
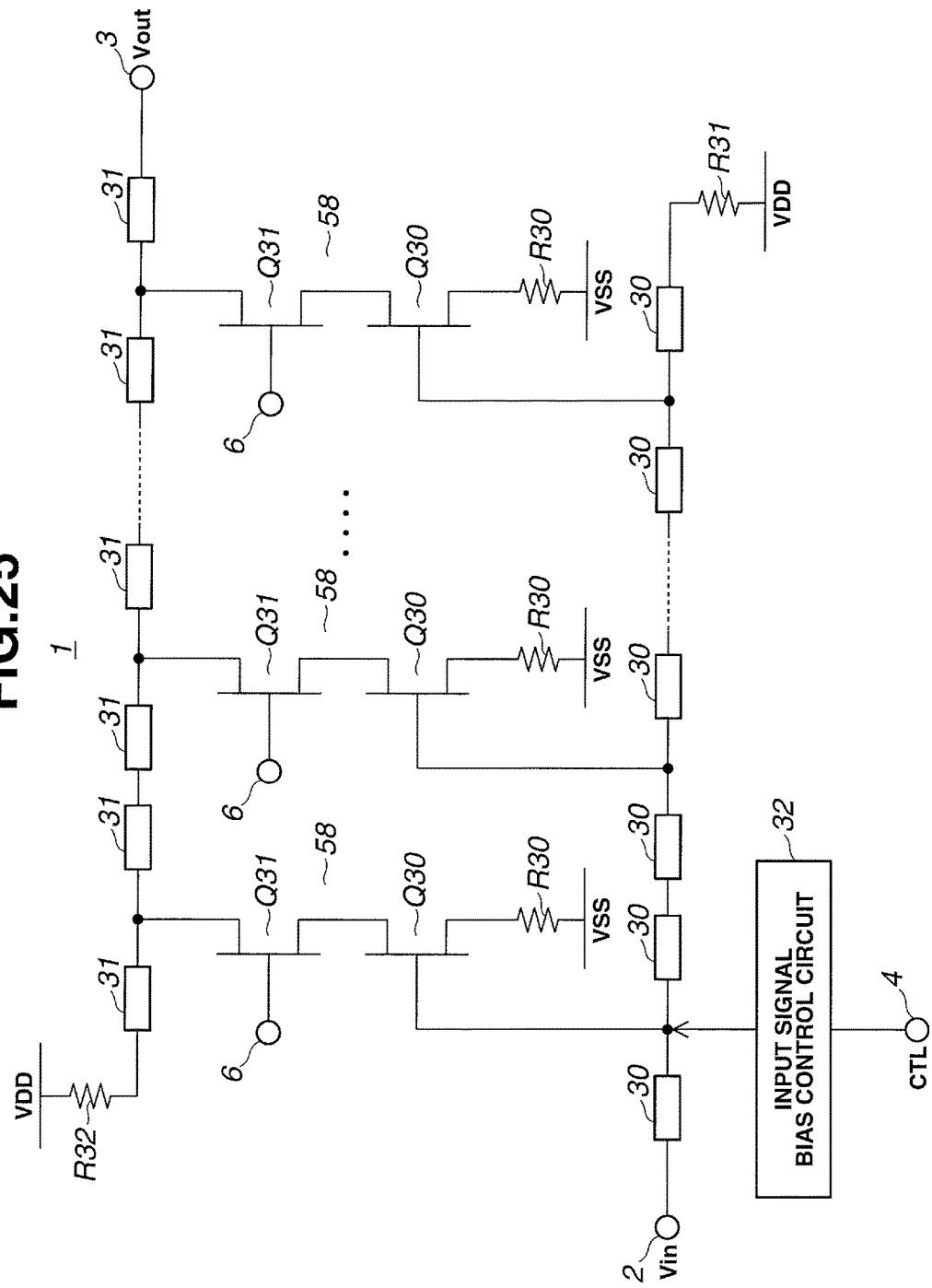
FIG. 25 is a circuit diagram showing the arrangement of an optical modulator driver circuit according to the seventh embodiment of the present invention.

In the fifth and sixth embodiments, a differential structure has been exemplified. However, not only the differential structure but also a single-phase distributed circuit can obtain the same effect by the same current amount control as described above. FIG. 25 is a circuit diagram showing the arrangement of an optical modulator driver circuit 1 according to this embodiment. The optical modulator driver circuit 1 shown in FIG. 25 includes an input transmission line 30 having an input end connected to an input terminal 2, an output transmission line 31 having an output end connected to an output terminal 3, a resistor R31 having one terminal connected to the output end of the input transmission line 30 and the other terminal connected to a power supply voltage VDD, a resistor R32 having one terminal connected to the input end of the output transmission line 31 and the other terminal connected to the power supply voltage VDD, an input signal bias control circuit 32 that gives a DC bias to an input signal Vin, and an amplifier 58 arranged along the input transmission line 30 and the output transmission line 31.

Each amplifier 58 shown in FIG. 25 includes a transistor Q30 having a gate connected to the input transmission line 30, a transistor Q31 having a gate connected to a bias terminal 6, a drain connected to the output transmission line 31, and a source connected to the drain of the transistor Q30, and a resistor R30 having one terminal connected to the source of the transistor Q30 and the other terminal connected to a power supply voltage VSS (VDD>VSS). A predetermined bias voltage is applied to the bias terminal 6.

In the circuit according to this embodiment, the input signal bias control circuit 32 serving as a current amount adjustment circuit is added. The input signal bias control circuit 32 adjusts the DC bias level of the input signal Vin in accordance with a control signal CTL input to an operation mode switching control terminal 4, thereby adjusting the amount of the current flowing through the amplifier 58. That is, in the linear operation mode, the DC bias level of the input signal Vin is raised to increase the current amount, thereby raising the response linearity. In the limit operation mode, the DC bias level of the input signal Vin is lowered to decrease the current amount, thereby saving power.

FIG. 25 shows a circuit example in which FETs are used as the transistors Q30 and Q31. As in the above-described embodiments, the transistor is not limited to an FET, and a bipolar transistor may be used. If a bipolar transistor is used, the gate in the above description is replaced with a base, the drain is replaced with a collector, and the source is replaced with an emitter. Additionally, in the example of FIG. 25, a circuit with a cascode structure is shown. However, the circuit may be formed by removing the cascode transistor Q31 on the upper side of each amplifier 58.

Eighth Embodiment

A detailed configuration method of the linear variable gain circuits 10 and 13 according to the second embodiment will be described next. As a general variable gain circuit, a Gilbert cell type variable gain circuit as shown in FIG. 26 or a Mayer type variable gain circuit shown in FIG. 27 is known.

Figure 26:
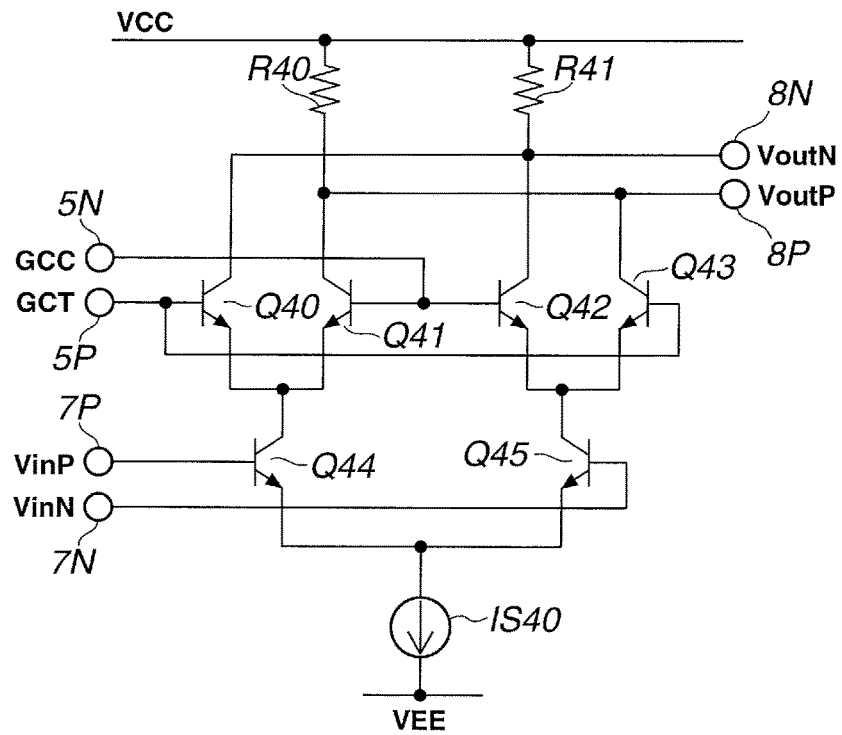
FIG. 26 is a circuit diagram showing the arrangement of a conventional Gilbert cell type variable gain circuit.

The Gilbert cell type variable gain circuit shown in FIG. 26 includes gain adjustment transistors Q40 and Q41 having bases connected to gain control terminals 5P and 5N and forming an upper differential pair (gain adjustment unit) configured to adjust the gain in accordance with gain control signals GCT and GCC, respectively, gain adjustment transistors Q42 and Q43 having bases connected to the gain control terminals 5N and 5P and forming an upper differential pair (gain adjustment unit) configured to adjust the gain in accordance with the gain control signals GCC and GCT, respectively, amplification transistors Q44 and Q45 having bases connected to a positive-phase input terminal 7P and a negative-phase input terminal 7N, respectively, and forming a lower differential pair (amplification unit), a constant current source IS40 having one terminal connected to the emitters of the amplification transistors Q44 and Q45 and the other terminal connected to a power supply voltage VEE, a resistor R40 having one terminal connected to a power supply voltage VCC and the other terminal connected to the collectors of the gain adjustment transistors Q41 and Q43, and a resistor R41 having one terminal connected to the power supply voltage VCC and the other terminal connected to the collectors of the gain adjustment transistors Q40 and Q42.

The collector of the amplification transistor Q44 is connected to the emitters of the gain adjustment transistors Q40 and Q41, and the collector of the amplification transistor Q45 is connected to the emitters of the gain adjustment transistors Q42 and Q43. A positive-phase output signal VoutP is output from the collectors of the transistors Q41 and Q43 (positive-phase output terminal 8P), and a negative-phase output signal VoutN is output from the collectors of the transistors Q40 and Q42 (negative-phase output terminal 8N).

Figure 27:
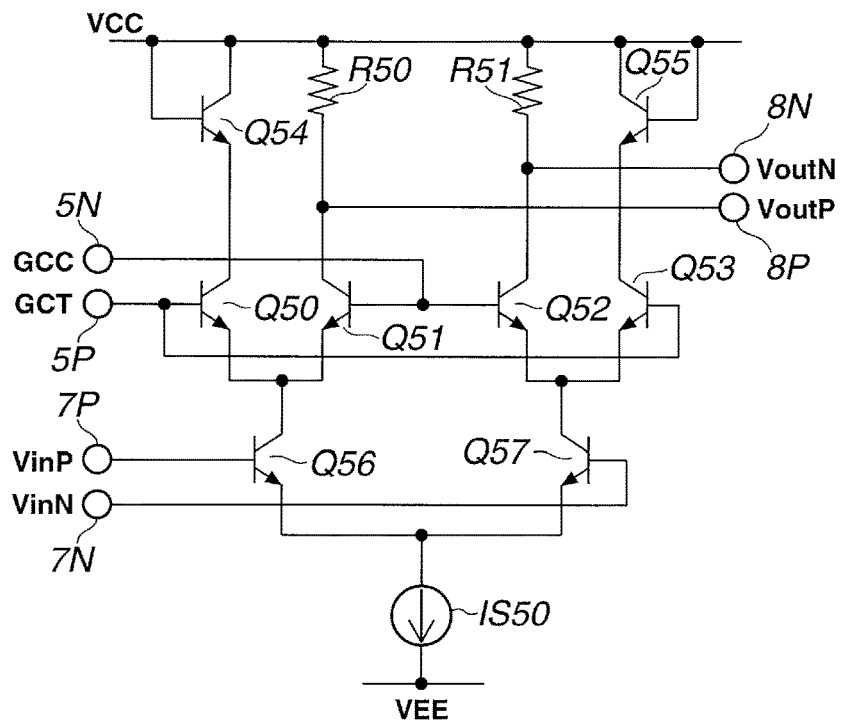
FIG. 27 is a circuit diagram showing the arrangement of a conventional Mayer type variable gain circuit.

The Mayer type variable gain circuit shown in FIG. 27 includes gain adjustment transistors Q50 and Q51 having bases connected to the gain control terminals 5P and 5N and forming an upper differential pair (gain adjustment unit) configured to adjust the gain in accordance with the gain control signals GCT and GCC, respectively, gain adjustment transistors Q52 and Q53 having bases connected to the gain control terminals 5N and 5P and forming an upper differential pair (gain adjustment unit) configured to adjust the gain in accordance with the gain control signals GCC and GCT, respectively, a transistor Q54 having a base and collector connected to the power supply voltage VCC and an emitter connected to the collector of the transistor Q50, a transistor Q55 having a base and collector connected to the power supply voltage VCC and an emitter connected to the collector of the transistor Q53, amplification transistors Q56 and Q57 having bases connected to the positive-phase input terminal 7P and the negative-phase input terminal 7N, respectively, and forming a lower differential pair (amplification unit), a constant current source IS50 having one terminal connected to the emitters of the amplification transistors Q56 and Q57 and the other terminal connected to the power supply voltage VEE, a resistor R50 having one terminal connected to the power supply voltage VCC and the other terminal connected to the collector of the gain adjustment transistor Q51, and a resistor R51 having one terminal connected to the power supply voltage VCC and the other terminal connected to the collector of the gain adjustment transistor Q52.

The collector of the amplification transistor Q56 is connected to the emitters of the gain adjustment transistors Q50 and Q51, and the collector of the amplification transistor Q57 is connected to the emitters of the gain adjustment transistors Q52 and Q53. The positive-phase output signal VoutP is output from the collector of the transistor Q51

(positive-phase output terminal 8P), and the negative-phase output signal VoutN is output from the collector of the transistor Q52 (negative-phase output terminal 8N).

However, the circuit configurations shown in FIGS. 26 and 27 intact cannot ensure the linearity of the input/output characteristic. To improve the linearity, it is important to insert an emitter resistor $R_{E\_L}$ whose value is large to some extent into the amplification transistors Q44, Q45, Q56, and Q57 to which input signals VinP and VinN are input. Especially, letting I be the amount of the current flowing through the variable gain circuit (the current amount of the current source IS40 or IS50), it is an important point to set the value of the product $I \times R_{E\_L}$ of the current amount I and the emitter resistance value $R_{E\_L}$ to be larger than an assumed input amplitude Ain ($I \times R_{E\_L} > $Ain).

The transistors Q40 to Q43 and Q50 to Q53 have a gain adjustment function. When an emitter resistor $R_{E\_U}$ is inserted into the transistors Q40 to Q43 and Q50 to Q53, the sensitivity of the gain adjustment can be controlled.

Figure 28:
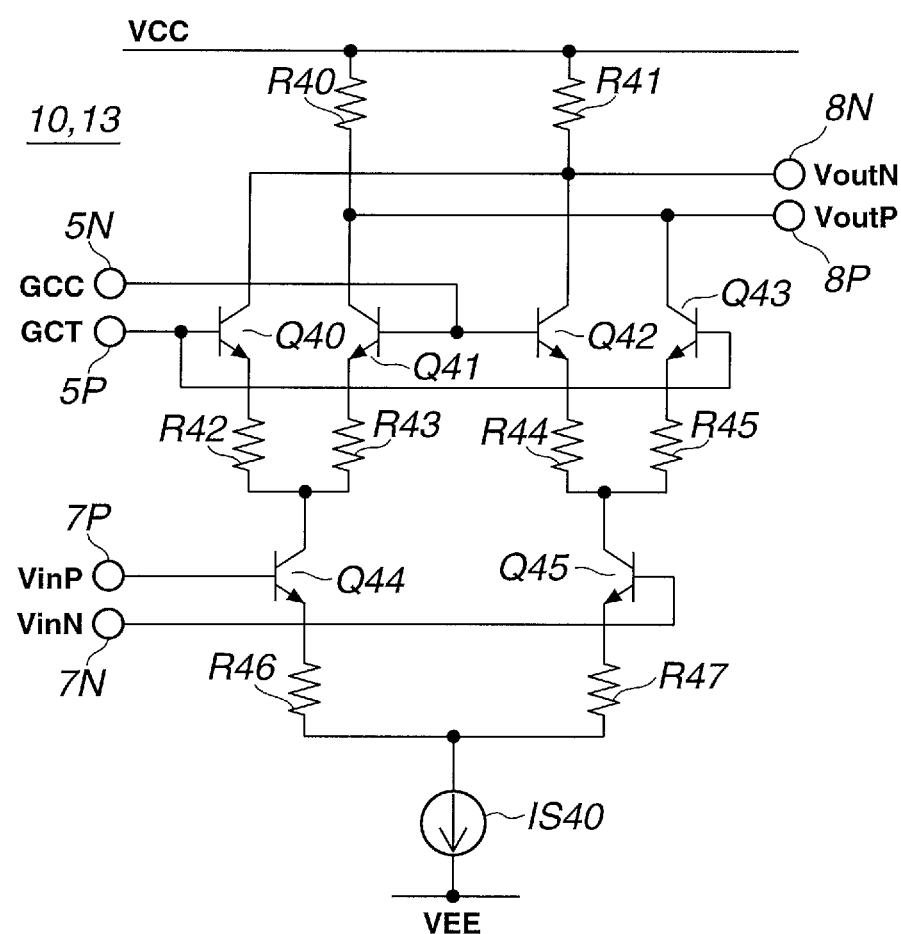
FIG. 28 is a circuit diagram showing an arrangement of a linear variable gain circuit according to the eighth embodiment of the present invention.

FIG. 28 is a circuit diagram showing an arrangement of linear variable gain circuit 10 and 13 according to this embodiment. In the linear variable gain circuit 10 or 13 shown in FIG. 28, a resistor R42 inserted between the emitter of the gain adjustment transistor Q40 and the collector of the amplification transistor Q44, a resistor R43 inserted between the emitter of the gain adjustment transistor Q41 and the collector of the amplification transistor Q44, a resistor R44 inserted between the emitter of the gain adjustment transistor Q42 and the collector of the amplification transistor Q45, a resistor R45 inserted between the emitter of the gain adjustment transistor Q43 and the collector of the amplification transistor Q45, a resistor R46 inserted between the current source IS40 and the emitter of the amplification transistor Q44, and a resistor R47 inserted between the current source IS40 and the emitter of the amplification transistor Q45 are added to the variable gain circuit shown in FIG. 26. As described above, the gain adjustment transistors Q40 to Q43 form a gain adjustment unit, and the amplification transistors Q44 and Q45 form an amplification unit. The resistance value of the resistors R42 to R45 is $R_{E\_U}$, and the resistance value of the resistors R46 and R47 is $R_{E\_L}$.

Figure 29:
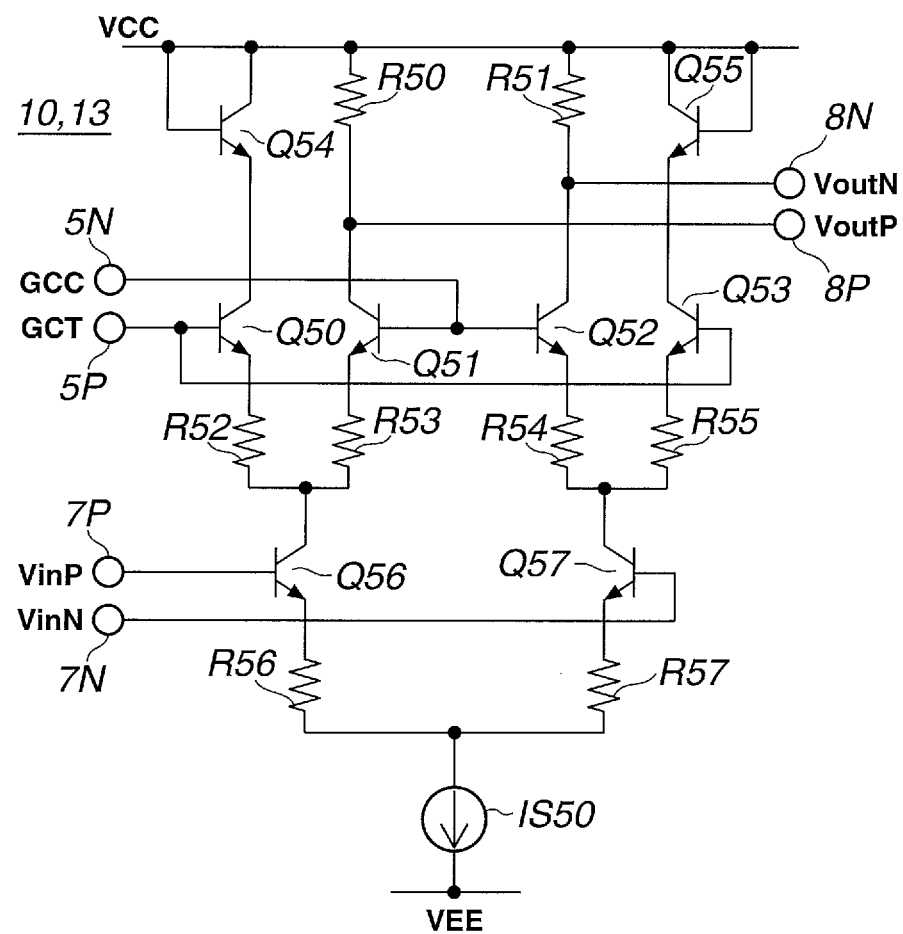
FIG. 29 is a circuit diagram showing another arrangement of a linear variable gain circuit according to the eighth embodiment of the present invention.

FIG. 29 is a circuit diagram showing another arrangement of the linear variable gain circuit 10 and 13 according to this embodiment. In the linear variable gain circuit 10 or 13 shown in FIG. 29, a resistor R52 inserted between the emitter of the gain adjustment transistor Q50 and the collector of the amplification transistor Q56, a resistor R53 inserted between the emitter of the gain adjustment transistor Q51 and the collector of the amplification transistor Q56, a resistor R54 inserted between the emitter of the gain adjustment transistor Q52 and the collector of the amplification transistor Q57, a resistor R55 inserted between the emitter of the gain adjustment transistor Q53 and the collector of the amplification transistor Q57, a resistor R56 inserted between the current source IS50 and the emitter of the amplification transistor Q56, and a resistor R57 inserted between the current source IS50 and the emitter of the amplification transistor Q57 are added to the variable gain circuit shown in FIG. 27. As described above, the gain adjustment transistors Q50 to Q53 form a gain adjustment unit, and the amplification transistors Q56 and Q57 form an amplification unit. The resistance value of the resistors R52 to R55 is $R_{E\_U}$, and the resistance value of the resistors R56 and R57 is $R_{E\_L}$.

As described above, in this embodiment, the emitter resistors R42 to R45 or R52 to R55 having the resistance value $R_{E\_U}$ and the emitter resistors R46 and R47 or R56 and R57 having the resistance value $R_{E\_LU}$ are added to the conventional variable gain circuit, thereby implementing the linear variable gain circuit 10 or 13 having excellent linearity.

Ninth Embodiment

Figure 30:
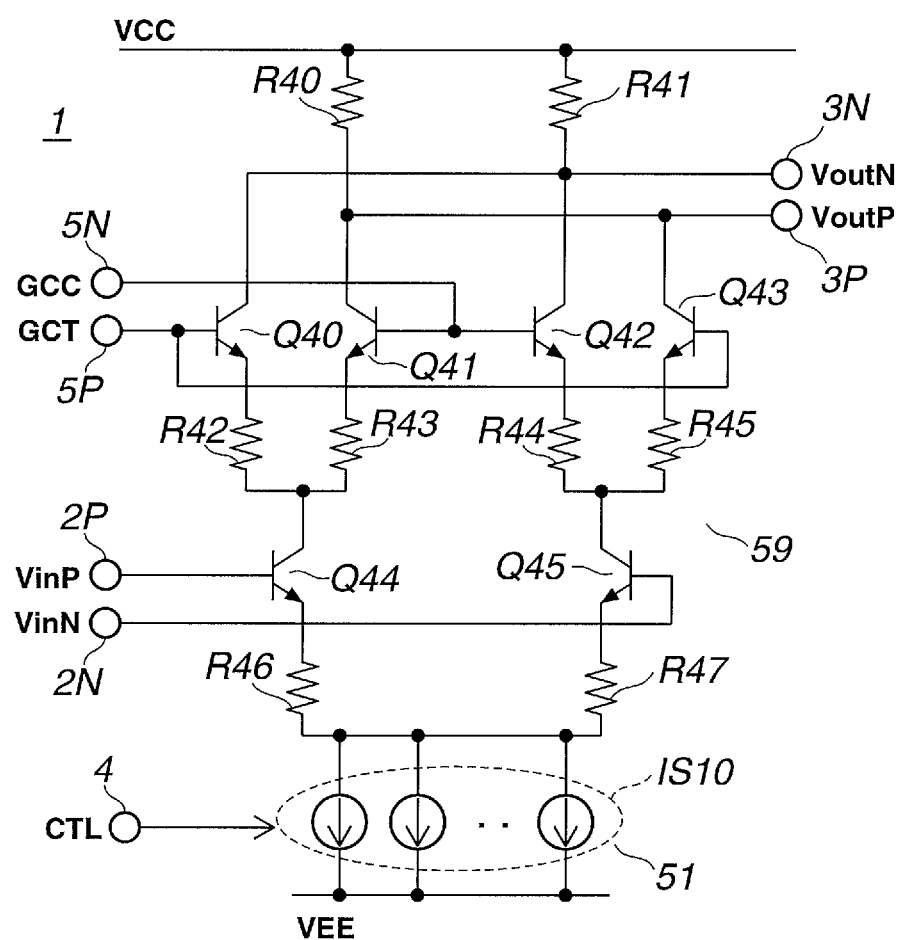
FIG. 30 is a circuit diagram showing an arrangement of an optical modulator driver circuit according to the ninth embodiment of the present invention.

In the second embodiment, the linear variable gain circuit 10 and the output circuit 11 are cascade-connected, or the input circuit 12 and the linear variable gain circuit 13 are cascade-connected. When the current source according to the first embodiment is applied to the arrangement according to the eighth embodiment, the arrangement of the first embodiment and that of the eight embodiment can be integrated. FIG. 30 is a circuit diagram showing an arrangement of an optical modulator driver circuit 1 according to this embodiment. The same reference numerals as in FIGS. 3 and 28 denote the same parts in FIG. 30. The optical modulator driver circuit 1 shown in FIG. 30 uses a current source IS10 described with reference to FIG. 3 in place of a current source IS40 shown in FIG. 28.

Figure 31:
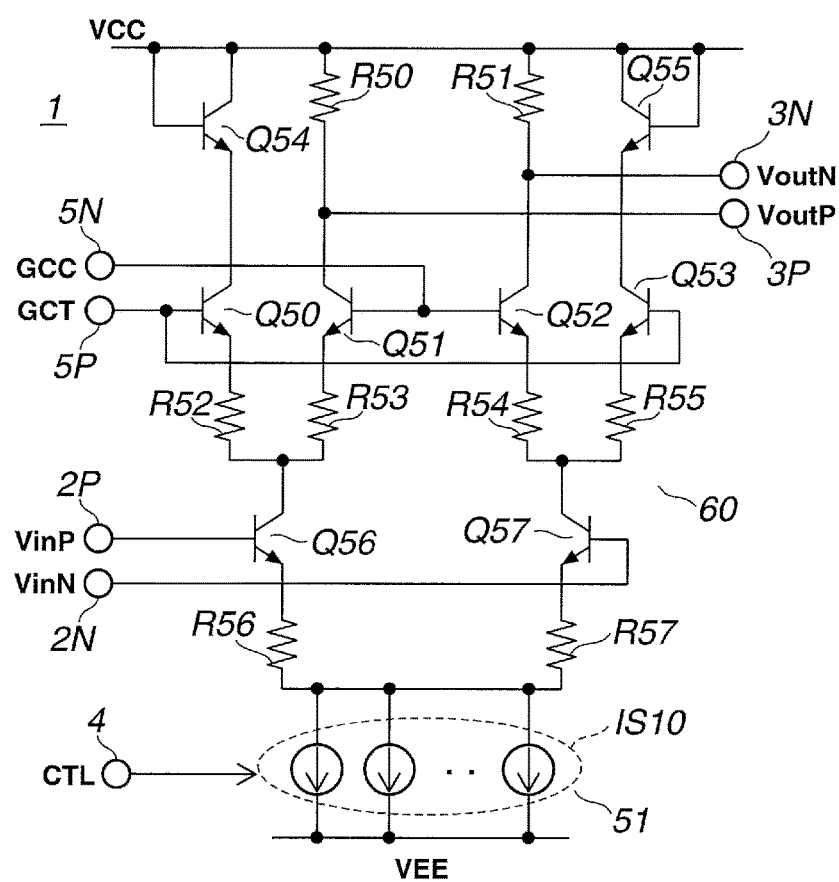
FIG. 31 is a circuit diagram showing another arrangement of the optical modulator driver circuit according to the ninth embodiment of the present invention.

FIG. 31 is a circuit diagram showing another arrangement of the optical modulator driver circuit 1 according to this embodiment. The same reference numerals as in FIGS. 3 and 29 denote the same parts in FIG. 31. The optical modulator driver circuit 1 shown in FIG. 31 uses the current source IS10 described with reference to FIG. 3 in place of a current source IS50 shown in FIG. 29.

Figure 32:
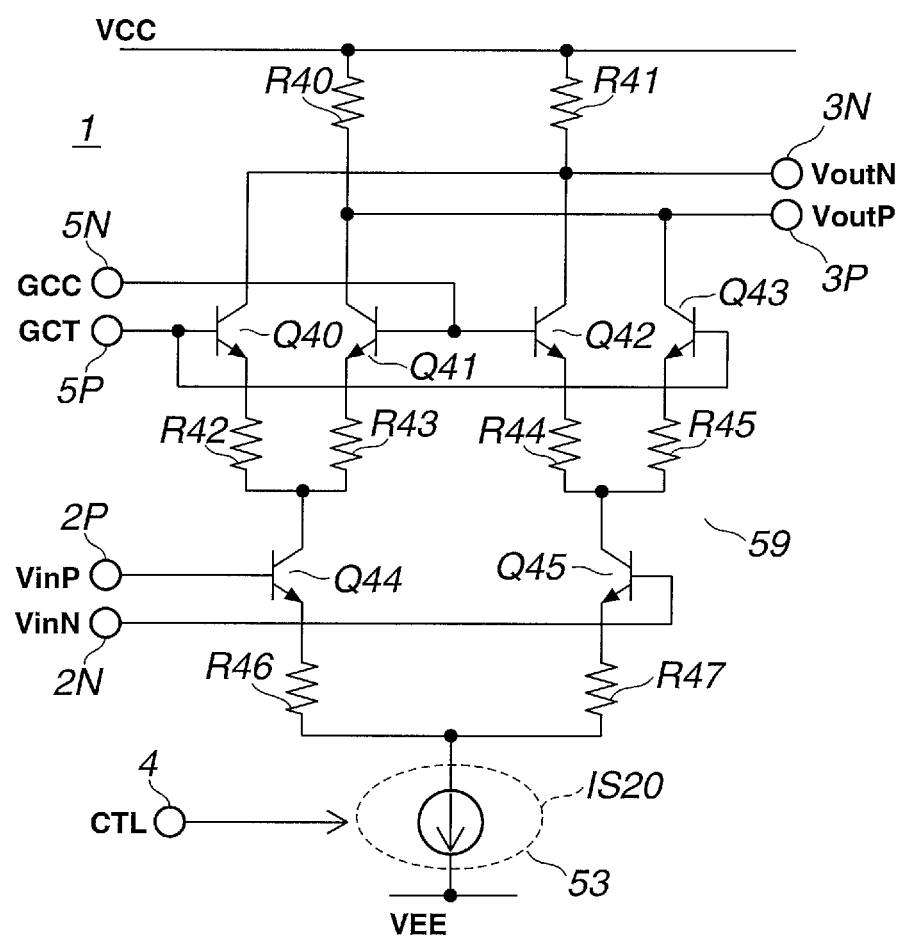
FIG. 32 is a circuit diagram showing still another arrangement of the optical modulator driver circuit according to the ninth embodiment of the present invention.

FIG. 32 is a circuit diagram showing still another arrangement of the optical modulator driver circuit 1 according to this embodiment. The same reference numerals as in FIGS. 4 and 28 denote the same parts in FIG. 32. The optical modulator driver circuit 1 shown in FIG. 32 uses a current source IS20 described with reference to FIG. 4 in place of the current source IS40 shown in FIG. 28.

Figure 33:
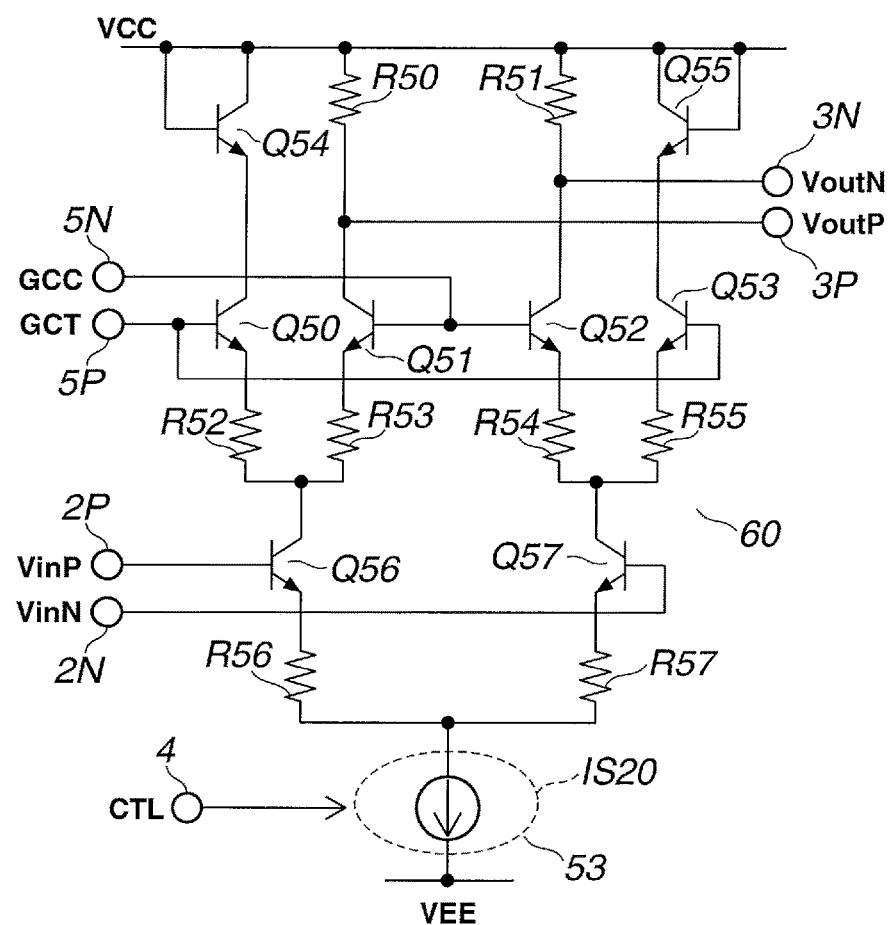
FIG. 33 is a circuit diagram showing still another arrangement of the optical modulator driver circuit according to the ninth embodiment of the present invention.

FIG. 33 is a circuit diagram showing still another arrangement of the optical modulator driver circuit 1 according to this embodiment. The same reference numerals as in FIGS. 4 and 29 denote the same parts in FIG. 33. The optical modulator driver circuit 1 shown in FIG. 33 uses the current source IS20 described with reference to FIG. 4 in place of the current source IS50 shown in FIG. 29. Reference numerals 59 and 60 in FIGS. 30 to 33 denote linear variable gain circuits. The linear variable gain circuits 59 and 60 correspond to the linear variable gain circuits 10 and 13 from which the current sources IS40 and IS50 are removed, respectively.

As described above, when the current source IS10 or IS20 according to the first embodiment is used in place of the current source IS40 or IS50 according to the eighth embodiment, the components cascade-connected in the second embodiment can be integrated.

10th Embodiment

Figure 34:
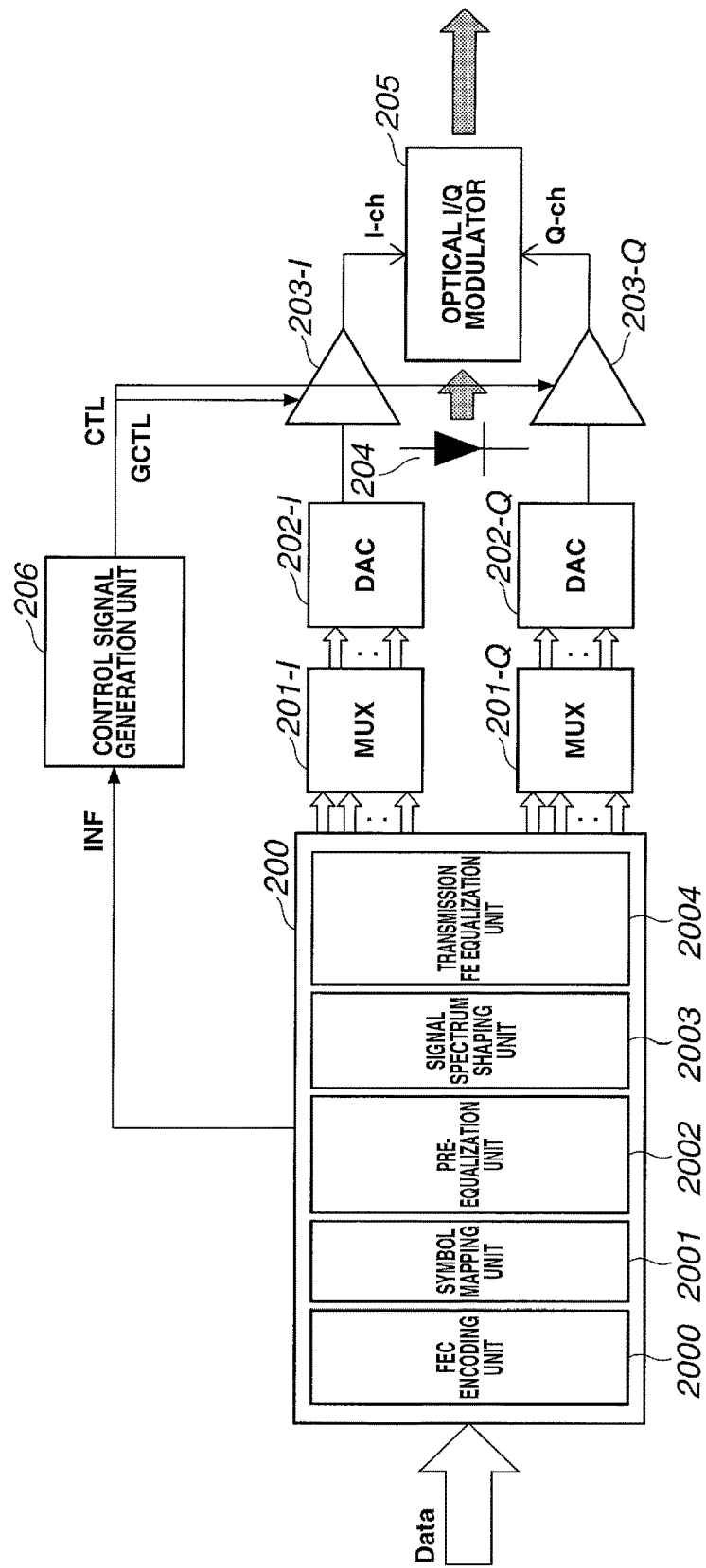
FIG. 34 is a block diagram showing the arrangement of an optical transmitter according to the 10th embodiment of the present invention.

A method of executing linearity control and gain control of an optical modulator driver circuit will be described next. FIG. 34 is a block diagram showing the arrangement of an optical transmitter according to this embodiment. The same reference numerals as in FIG. 42 denote the same parts in FIG. 34. The optical transmitter according to this embodiment includes a DSP 200 (signal processing means) that performs digital signal processing of transmission data Data in accordance with the operation configuration of an optical transmission system, MUXs 201-I and 201-Q that multiplex symbols output from the DSP 200, DACs 202-I and 202-Q that convert data output from the MUXs 201-I and 201-Q into analog signals, optical modulator driver circuits 203-I and 203-Q that amplify signals output from the DACs 202-I and 202-Q, an LD 204 serving as a light source, an optical I/Q modulator 205 that modulates continuous light from the LD 204 by the output signals from the optical modulator driver circuits 203-I and 203-Q and outputs the signal, and a control signal generation unit 206 that generates a control signal CTL to the optical modulator driver circuits 203-I and 203-Q in accordance with information INF about the operation configuration of the optical transmission system.

The DSP 200 includes an FEC encoding unit 2000 that performs FEC encoding for the transmission data Data, a symbol mapping unit 2001 that executes symbol mapping according to a modulation format for the signal that has undergone the FEC encoding, a pre-equalization unit 2002 that performs, for the signal, pre-equalization processing of wavelength dispersion or nonlinear response of an optical modulator, a signal spectrum shaping unit 2003 that performs spectrum shaping (Nyquist filter) processing for the signal to suppress inter-channel crosstalk at the time of WDM transmission, a transmission FE equalization unit 2004 that performs, for the signal, transmission FE equalization for the optical modulator, and the like. In the DSP 200, the modulation format can be changed in accordance with an instruction from outside. In addition, the functions of the pre-equalization unit 2002 and the signal spectrum shaping unit 2003 can be ON/OFF-controlled.

In this embodiment, the information INF about the operation configuration (modulation format or the presence/absence of transmission end signal processing) of the optical transmission system is output (extracted) from the DSP 200. The control signal generation unit 206 applies operation processing to the information INF. The operation result is used as the control signal CTL to control the balance between power consumption and the linearity of the input/output characteristic of the optical modulator driver circuits 203-I and 203-Q and the gain of the optical modulator driver circuits 203-I and 203-Q.

A method of adjusting and controlling the balance between power consumption and the linearity of the input/output characteristic of the optical modulator driver circuits 203-I and 203-Q will be described next in detail. Items that particularly have a close relationship to the linearity requirement to the optical modulator driver circuits 203-I and 203-Q in the operation configuration of the optical transmission system are (A) modulation format, (B) pre-equalization function, and (C) signal spectrum shaping function (Nyquist filter), as shown in Table 1.

TABLE 1

| Modulation format | | Pre-equalization function | | Signal spectrum shaping function | |
|---|---|---|---|---|---|
| QAM | QPSK | ON | OFF | ON | OFF |
| linearity is necessary | linearity is unnecessary | linearity is necessary | linearity is unnecessary | linearity is necessary | linearity is unnecessary |

As for the modulation format, in QPSK that handles a binary electrical signal, the linearity of the input/output characteristic of the optical modulator driver circuits 203-I and 203-Q is unnecessary. In QAM that handles an electrical signal with amplitude modulation, the linearity is necessary.

As for the pre-equalization function, if the pre-equalization function is OFF, the linearity of the input/output characteristic of the optical modulator driver circuits 203-I and 203-Q is unnecessary. If the pre-equalization function is ON, the linearity is necessary. As for the signal spectrum shaping (Nyquist filter) function as well, if the signal spectrum shaping function is OFF, the linearity of the input/output characteristic of the optical modulator driver circuits 203-I and 203-Q is unnecessary. If the signal spectrum shaping function is ON, the linearity is necessary. In the entire system, the necessity of the linearity of the input/output characteristic of the optical modulator driver circuits 203-I and 203-Q needs to be determined based on the plurality of items.

In an operation configuration that needs the linearity of the input/output characteristic of the optical modulator driver circuits 203-I and 203-Q concerning all functions shown in Table 1, the optical modulator driver circuits 203-I and 203-Q need to reliably be operated in the linear operation mode. In a case where the linearity of the input/output characteristic of the optical modulator driver circuits 203-I and 203-Q is necessary concerning one of the functions shown in Table 1 as well, the optical modulator driver circuits 203-I and 203-Q can be operated in the linear operation mode.

However, in a case where necessity and unnecessity coexist, for example, the linearity of the input/output characteristic of the optical modulator driver circuits 203-I and 203-Q is necessary for one function shown in Table 1 but unnecessary for another function, operating the optical modulator driver circuits 203-I and 203-Q linearly to some extent may suffice. In this case, using the optical modulator driver circuits 203-I and 203-Q in an intermediate mode between the complete linear operation mode and limit operation mode may be optimum from the viewpoint of the balance between the linearity and power consumption.

In an operation configuration that does not need the linearity of the input/output characteristic of the optical modulator driver circuits 203-I and 203-Q concerning all functions shown in Table 1, when the optical modulator driver circuits 203-I and 203-Q are operated in the limit operation mode, the waveform quality (S/N: signal-to-noise ratio) of binary electrical signals that are the output signals of the optical modulator driver circuits 203-I and 203-Q can be improved, and the transmission quality can also be expected to improve. Considering the above explanation, the following control method is considered to be usable for control of the linearity of the input/output characteristic of the optical modulator driver circuits 203-I and 203-Q.

Figure 35:
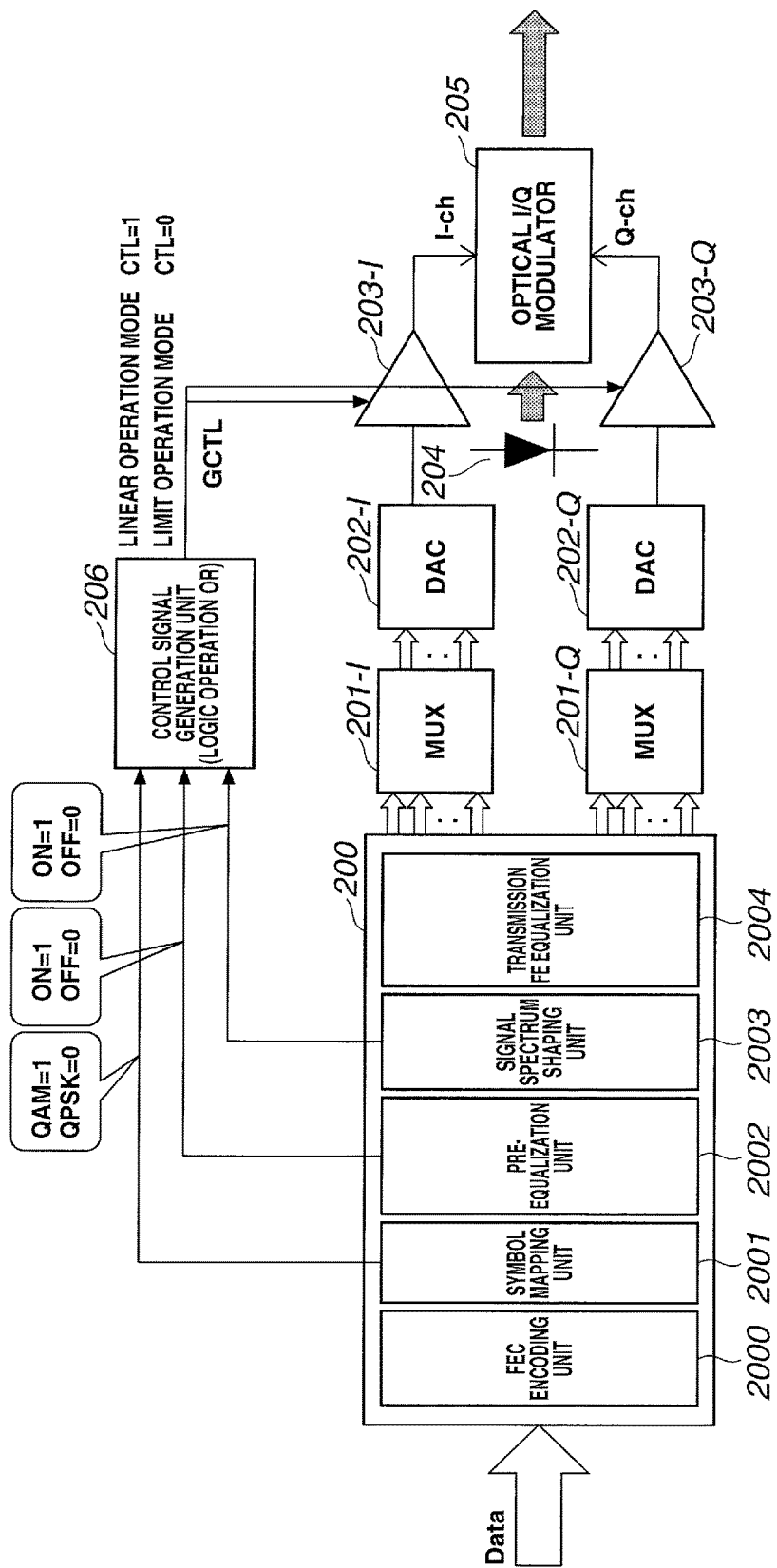
FIG. 35 is a block diagram for explaining a method of controlling the linearity of an optical modulator driver circuit according to the 10th embodiment of the present invention.

FIG. 35 is a block diagram for explaining a linearity control method according to this embodiment. In the example shown in FIG. 35, operation processing performed by the control signal generation unit 206 is OR processing. In the QAM format, the symbol mapping unit 2001 of the DSP 200 outputs "1". In the QPSK format, the symbol mapping unit 2001 outputs "0". When the pre-equalization function is ON, the pre-equalization unit 2002 of the DSP 200 outputs "1". When the pre-equalization function is OFF, the pre-equalization unit 2002 outputs "0". When the signal spectrum shaping (Nyquist filter) function is ON, the signal spectrum shaping unit 2003 of the DSP 200 outputs "1". When the signal spectrum shaping function is OFF, the signal spectrum shaping unit 2003 outputs "0".

The control signal generation unit 206 ORs the pieces of information output from the symbol mapping unit 2001, the pre-equalization unit 2002, and the signal spectrum shaping unit 2003. If at least one piece of information is "1", that is, at least one function that needs the linearity of the input/output characteristic of the optical modulator driver circuits 203-I and 203-Q is enabled, the control signal CTL is "1". In accordance with the control signal CTL, the optical modulator driver circuits 203-I and 203-Q operate in the linear operation mode. If all the pieces of information output from the symbol mapping unit 2001, the pre-equalization unit 2002, and the signal spectrum shaping unit 2003 are "0", that is, the linearity of the input/output characteristic of the optical modulator driver circuits 203-I and 203-Q is unnecessary, the control signal CTL is "0". In accordance with the control signal CTL, the optical modulator driver circuits 203-I and 203-Q operate in the limit operation mode. As described above, in the example shown in FIG. 35, switching between the complete linear operation mode and limit operation mode is executed.

Note that in the example shown in FIG. 35, (A) modulation format, (B) pre-equalization, and (C) spectrum shaping are the targets of information extraction. However, any other information may be extracted in addition to (A) to (C) if there is another function or operation configuration concerning the linearity requirement to the optical modulator driver circuits 203-I and 203-Q.

Figure 36:
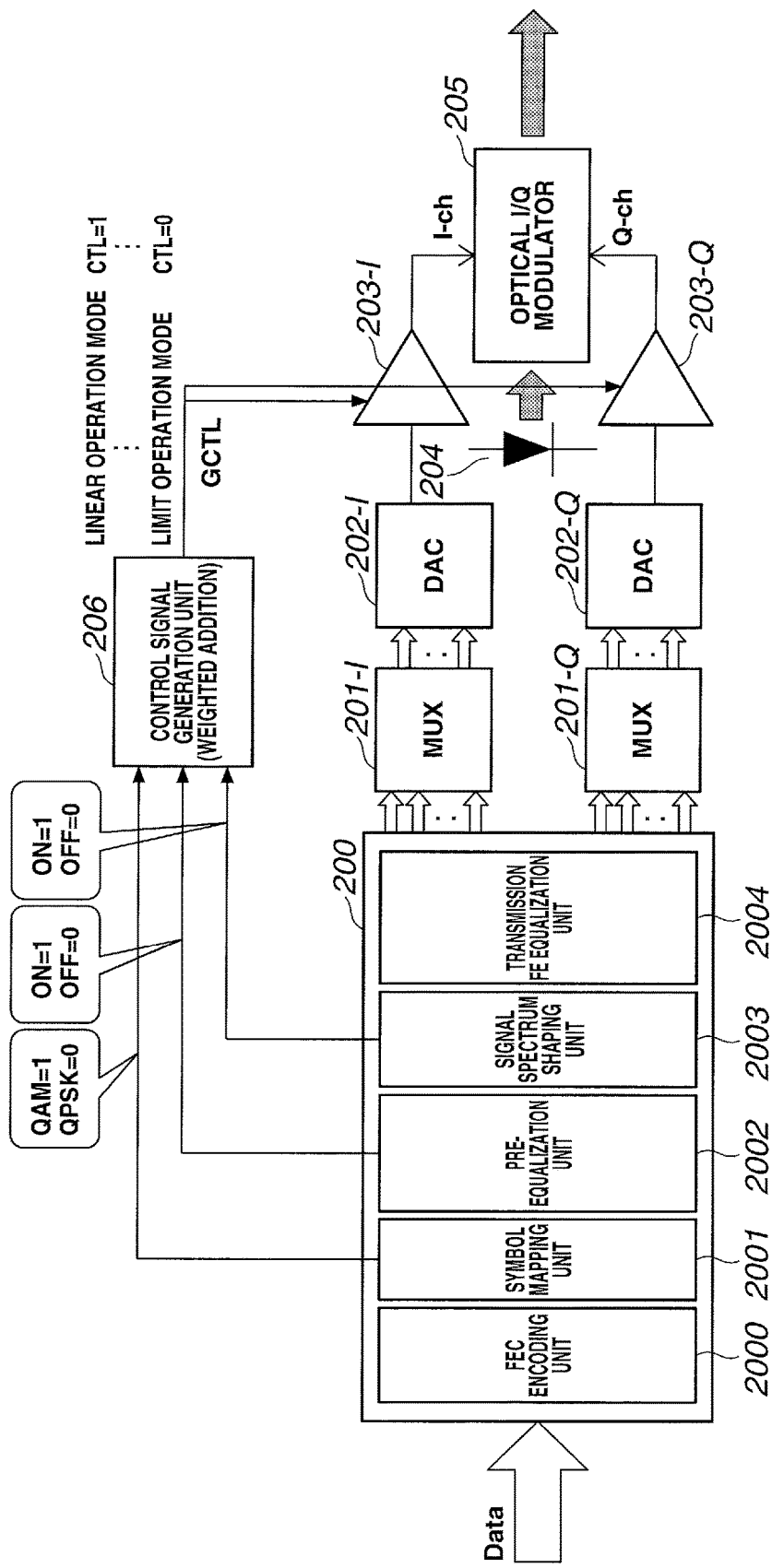
FIG. 36 is a block diagram for explaining another method of controlling the linearity of the optical modulator driver circuit according to the 10th embodiment of the present invention.

FIG. 36 is a block diagram for explaining another linearity control method according to this embodiment. In the example shown in FIG. 36, operation processing performed by the control signal generation unit 206 is weighted addition processing. Here, not only the two, complete linear operation mode and limit operation mode but also an intermediate operation mode between them are assumed as the operation modes of the optical modulator driver circuits 203-I and 203-Q. As in the above-described example, in the QAM format, the symbol mapping unit 2001 of the DSP 200 outputs "1". In the QPSK format, the symbol mapping unit 2001 outputs "0". When the pre-equalization function is ON, the pre-equalization unit 2002 of the DSP 200 outputs "1". When the pre-equalization function is OFF, the pre-equalization unit 2002 outputs "0". When the signal spectrum shaping (Nyquist filter) function is ON, the signal spectrum shaping unit 2003 of the DSP 200 outputs "1". When the signal spectrum shaping function is OFF, the signal spectrum shaping unit 2003 outputs "0".

Let INFa be the information "1" or "0" output from the symbol mapping unit 2001, INFb be the information "1" or "0" output from the pre-equalization unit 2002, and INFc be the information "1" or "0" output from the signal spectrum shaping unit 2003. Weighted addition processing by the control signal generation unit 206 is expressed as $$CTL = INFa \times a + INFb \times b + INFc \times c \quad (1)$$

where $\underline{a}$, b, and c are preset weight coefficients ($\underline{a}$, b, and c are values of 0 to 1, a+b+c=1). As the weight coefficients $\underline{a}$, b, and c corresponding to the functions of (A) modulation format, (B) pre-equalization, and (C) spectrum shaping, a large value is set for a function whose linearity requirement to the optical modulator driver circuits 203-I and 203-Q is high. By setting the weight coefficients $\underline{a}$, b, and c, when a function with a high linearity requirement to the optical modulator driver circuits 203-I and 203-Q is enabled in the DSP 200, the optical modulator driver circuits 203-I and 203-Q can be adjusted so as to obtain excellent linearity of the operation. If linearity to some extent suffices, the optical modulator driver circuits 203-I and 203-Q are adjusted so as to obtain linearity according to this, thereby suppressing power consumption of the optical modulator driver circuits 203-I and 203-Q.

In the example shown in FIG. 36 as well, (A) modulation format, (B) pre-equalization, and (C) spectrum shaping are the targets of information extraction. However, any other information may be extracted in addition to (A) to (C) if there is another function or operation configuration concerning the linearity requirement to the optical modulator driver circuits 203-I and 203-Q.

In an optical transmitter capable of finely adjusting the linearity of the input/output characteristic of the optical modulator driver circuits 203-I and 203-Q, as in the example shown in FIG. 36, the information of the optical transmission distance may be added as a linearity requirement item. That is, if the optical transmission distance is long, the transmission signal quality needs to be raised, and therefore, the linearity of the input/output characteristic of the optical modulator driver circuits 203-I and 203-Q is set high. If the optical transmission distance is short, nonlinearity to some extent is assumed to be allowed in the optical modulator driver circuits 203-I and 203-Q. Hence, the linearity is lowered to suppress the power consumption of the optical modulator driver circuits 203-I and 203-Q.

As the optical modulator driver circuit 203-I, one of the arrangements shown in FIGS. 3, 4, and 19 to 25 can be used. In FIGS. 3 and 19 to 24, VinP is a positive-phase input signal input to a positive-phase input terminal 2P of the optical modulator driver circuit 203-I, VinN is a negative-phase input signal input to a negative-phase input terminal 2N of the optical modulator driver circuit 203-I, VoutP is a positive-phase output signal output from a positive-phase output terminal 3P of the optical modulator driver circuit 203-I to the optical I/Q modulator 205, and VoutN is a negative-phase output signal output from a negative-phase output terminal 3N of the optical modulator driver circuit 203-I to the optical I/Q modulator 205. In FIG. 25, Vin is an input signal input to an input terminal 2 of the optical modulator driver circuit 203-I, and Vout is an output signal output from an output terminal 3 of the optical modulator driver circuit 203-I to the optical I/Q modulator 205.

The circuits shown in FIGS. 3, 19, 21, and 23 correspond to the linearity control method described with reference to FIG. 35. In the circuit shown in FIG. 3, 19, 21, or 23, a plurality of parallel current sources IS10 capable of ON/OFF-controlling the tail current of a differential amplifier 50, 54, or 56 are used to control the amount of the current flowing through the differential amplifier 50, 54, or 56, thereby implementing mode switching of the optical modulator driver circuit 203-I. When the linear operation of the optical modulator driver circuit 203-I is needed, all current sources IS10 are turned on based on the control signal CTL=1 to maximize the tail current amount, thereby enabling an operation in the linear operation mode. When the limit operation of the optical modulator driver circuit 203-I is needed, at least one of the plurality of current sources IS10 is turned on, and the rest is turned off based on the control signal CTL=0 to reduce the tail current amount, thereby enabling an operation in the limit operation mode.

As described with reference to FIG. 5, in the optical modulator driver circuit 203-I using the arrangement shown in FIG. 3, 19, 21, or 23, the tail current amount of the differential amplifiers 50, 54, or 56 can be made smaller in the limit operation mode than in the linear operation mode. Power consumption can be reduced accordingly.

The circuits shown in FIGS. 4, 20, 22, and 24 correspond to the linearity control method described with reference to FIG. 36. In the circuit shown in FIG. 4, 20, 22, or 24, a variable current source IS20 capable of controlling the tail current of a differential amplifier 52, 55, or 57 is used to control the amount of the current flowing through the differential amplifier 52, 55, or 57, thereby implementing mode switching of the optical modulator driver circuit 203-I.

As described with reference to FIG. 6, when the linear operation of the optical modulator driver circuit 203-I using the arrangement shown in FIG. 4, 20, 22, or 24 is needed, the current amount is set large (to the maximum value) based on the control signal CTL, thereby enabling an operation in the linear operation mode. When the limit operation of the optical modulator driver circuit 203-I is needed, the current amount is reduced based on the control signal CTL, thereby enabling an operation in the limit operation mode. When this control method is employed, the linearity and power consumption can finely be adjusted not by stepwise control as in the circuit shown in FIG. 3 but by analog (continuous) control. The amount of the current capable of flowing to one variable current source IS20 is limited. Hence, the number of variable current sources IS20 is determined in accordance with the necessary current amount, and the variable current sources IS20 are connected in parallel.

Note that the arrangement shown in FIG. 25 is applicable to both the linearity control method described with reference to FIG. 35 and the linearity control method described with reference to FIG. 36.

The detailed arrangement of the current source of the optical modulator driver circuit 203-I will be described next. The arrangement and control method of the current source IS10 of the optical modulator driver circuit 203-I using the arrangement shown in FIG. 3, 19, 21, or 23 are the same as described with reference to FIGS. 15 and 16. Note that a voltage $V_{CS\_ON}$ shown in FIG. 16 corresponds to CTL=1, and a voltage $V_{CS\_OFF}$ corresponds to CTL=0.

The arrangement and control method of the current source IS20 of the optical modulator driver circuit 203-I using the arrangement shown in FIG. 4, 20, 22, or 24 are the same as described with reference to FIGS. 17 and 18. The arrangement of the current source itself is the same as in FIG. 15, but the control method is different. Since the current source IS20 shown in FIG. 17 is used as a variable current source, the continuous control signal CTL as shown in FIG. 18 is used. When the continuous control signal CTL is used, the input/output characteristic of the optical modulator driver circuit 203-I shown in FIG. 4 can continuously be changed from the linear operation mode to the limit operation mode. To operate the optical modulator driver circuit 203-I in the complete linear operation mode, CTL=1 is set.

Note that FIGS. 3, 4, 15, 17, and 19 to 25 show examples in which bipolar transistors are used as the transistors Q10 to Q14, Q20 to Q24, Q30, and Q31. However, the transistor is not limited to a bipolar transistor, and an FET-based transistor may be used. If an FET-based transistor is used, the base in the above description is replaced with a gate, the collector is replaced with a drain, and the emitter is replaced with a source.

In FIGS. 3, 4, and 19 to 25, the arrangement of the optical modulator driver circuit 203-I of I (in-phase) channel has been described. This also applies to the arrangement of the optical modulator driver circuit 203-Q of Q (quadrature) channel.

The control signal generation unit 206 can be implemented using a circuit or a computer that operates based on software. The computer includes a CPU (Central Processing Unit) and a storage device. The CPU executes processing of the control signal generation unit 206 to be described in this embodiment and the subsequent embodiments in accordance with a program stored in the storage device.

As described above, in this embodiment, the linear operation mode and the limit operation mode of the optical modulator driver circuits 203-I and 203-Q can appropriately selectively be used in accordance with the operation configuration of the optical transmission system, and power consumption can be reduced in the limit operation mode. In addition to use in the two modes, that is, the linear operation mode and the limit operation mode, use in an intermediate operation mode between them is also possible. The optical modulator driver circuits 203-I and 203-Q can be set in a state optimum for the operation configuration of the optical transmission system.

11th Embodiment

Figure 37:
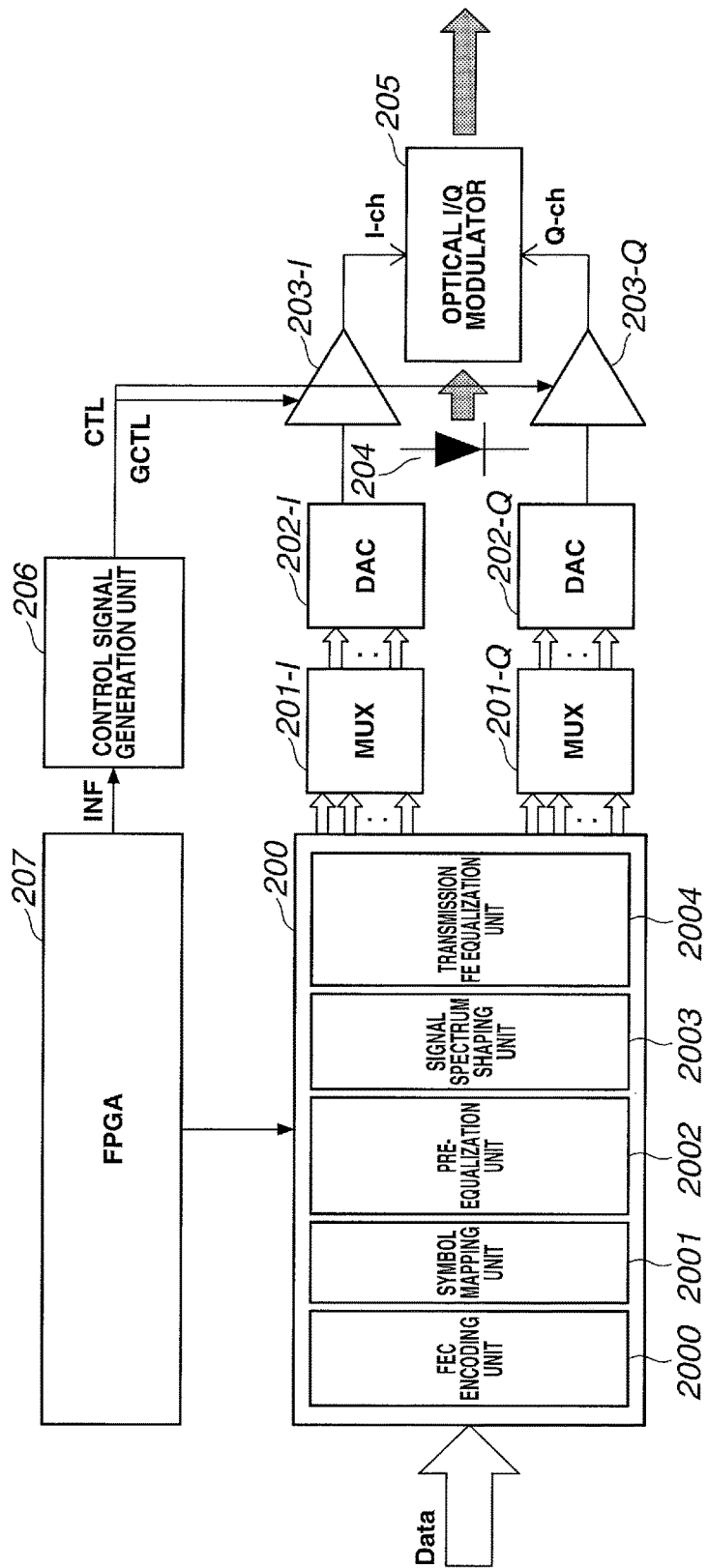
FIG. 37 is a block diagram showing the arrangement of an optical transmitter according to the 11th embodiment of the present invention.

The 11th embodiment of the present invention will be described next. FIG. 37 is a block diagram showing the arrangement of an optical transmitter according to this embodiment. The same reference numerals as in FIG. 34 denote the same parts in FIG. 37. In the optical transmitter according to this embodiment, an FPGA (Field-Programmable Gate Array) 207 serving as a signal processing control means is added to the optical transmitter according to the 10th embodiment. Control of the operation configuration of a DSP 200 is executed using the FPGA 207, and information INF about the operation configuration is acquired from the FPGA 207. The rest of the arrangement is the same as described in the 10th embodiment.

Figure 38:
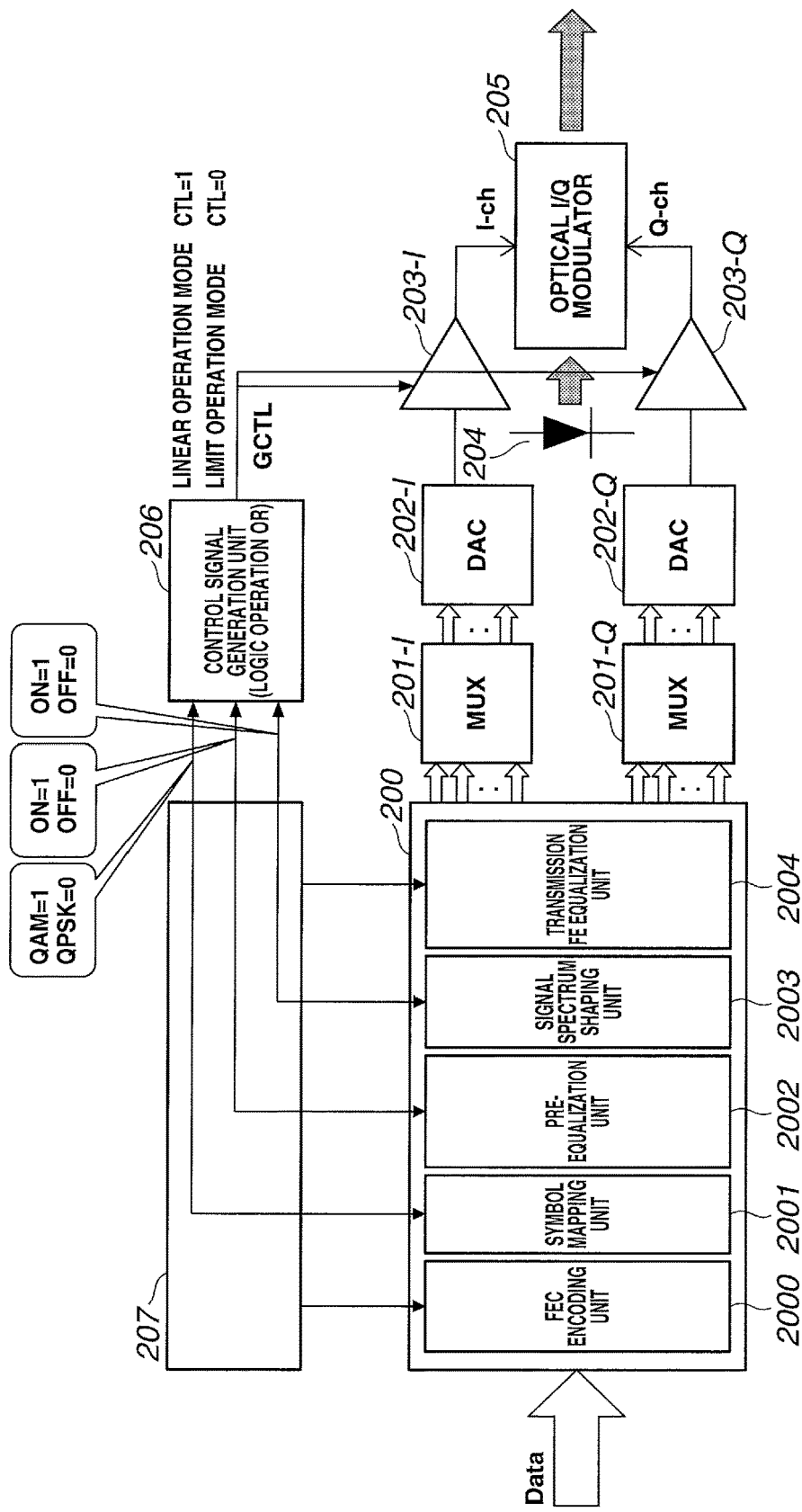
FIG. 38 is a block diagram for explaining a method of controlling the linearity of an optical modulator driver circuit according to the 11th embodiment of the present invention.

FIG. 38 is a block diagram for explaining a linearity control method according to this embodiment. As described above, in this embodiment, the information INF about the operation configuration (modulation format or the presence/absence of transmission end signal processing) of an optical transmission system is acquired from the FPGA 207. The FPGA 207 outputs "1" as information INFa about the modulation format in the QAM format, and "0" as the information INFa in the QPSK format. The FPGA 207 outputs "1" as information INFb about the pre-equalization function when the pre-equalization function is ON, and "0" as the information INFb when the pre-equalization function is OFF. The FPGA 207 outputs "1" as information INFc about the signal spectrum shaping (Nyquist filter) function when the signal spectrum shaping function is ON, and "0" as the information INFc when the signal spectrum shaping function is OFF. Operation processing performed by a control signal generation unit 206 shown in FIG. 38 is OR processing described in the example of FIG. 35. In the example shown in FIG. 38, the arrangement described with reference to FIG. 3, 15, 19, 21, 23 or 25 is used as optical modulator driver circuits 203-I and 203-Q.

Figure 39:
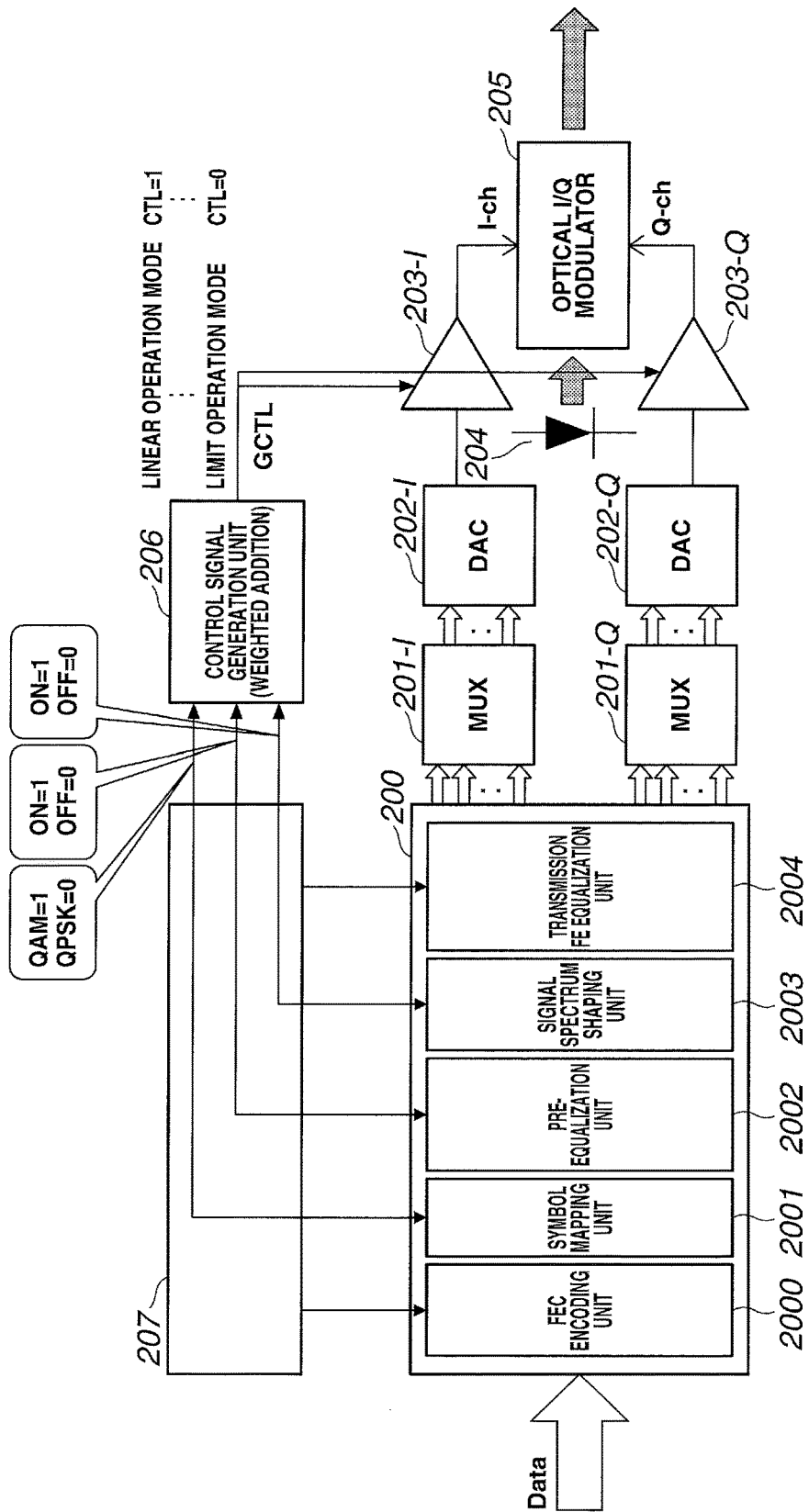
FIG. 39 is a block diagram for explaining another method of controlling the linearity of the optical modulator driver circuit according to the 11th embodiment of the present invention.

FIG. 39 is a block diagram for explaining another linearity control method according to this embodiment. The operation of the FPGA 207 is the same as described above. Operation processing performed by the control signal generation unit 206 shown in FIG. 39 is weighted addition processing described in the example of FIG. 36. In the example shown in FIG. 39, the arrangement described with reference to FIG. 4, 17, 20, 22, 24, or 25 is used as the optical modulator driver circuits 203-I and 203-Q.

In this embodiment, the same effects as in the 10th embodiment can thus be obtained. Note that in the optical transmitters according to the 10th and 11th embodiments, a nonlinear equalization function in the linear operation of the optical modulator driver circuit itself may be imparted to the pre-equalization unit 2002 of the DSP 200. In this case, a control signal that forcibly sets the optical modulator driver circuits 203-I and 203-Q in the complete limit operation mode may separately be given.

12th Embodiment

In the 10th and 11th embodiments, only the balance between power consumption and the linearity of the input/output characteristic of an optical modulator driver circuit is controlled. However, the gain of the optical modulator driver circuit may further be controlled.

The concept and method of gain control of the optical modulator driver circuit will be described below. A gain adjustment function has a close relationship to the input/output characteristic of an optical I/Q modulator 205 of the optical transmitter. The optical I/Q modulator 205 is formed from an MZ (Mach-Zehnder) modulator 300, as shown in FIG. 12.

The MZ modulator 300 exhibits a nonlinear input/output characteristic generally represented by a sine (sinusoidal) curve, as shown in FIG. 13. Hence, when the optical I/Q modulator 205 is driven by a driving amplitude capable of obtaining a maximum transmittance, distortion occurs. When the optical I/Q modulator is driven by a binary signal, as in the conventional 100-Gb/s optical transmission system, the distortion is not problematic. However, when Nyquist filter or pre-equalization processing is applied, or a higher-order multilevel modulation format with amplitude modulation such as the QAM format is used, the electrical signal that drives the optical I/Q modulator 205 is not a simple "0" or "1" signal but a signal finely including information in the amplitude axis direction. For this reason, the distortion of the optical I/Q modulator 205 poses a problem.

However, unlike the input/output characteristic of a limit type driver circuit (the input/output characteristic changes depending on a driver used), which is hard to generalize, the input/output characteristic of the MZ modulator 300 can be generalized as a sine curve. For this reason, giving a characteristic opposite to the input/output characteristic of the MZ modulator 300 to a pre-equalization unit 2002 of a DSP 200 is assumed to be relatively easy. When a characteristic opposite to the input/output characteristic of the MZ modulator 300 is given to the pre-equalization unit 2002 of the DSP 200, pre-equalization can be performed such that a linear optical signal is obtained after modulation. Hence, optical modulator driver circuits 203-I and 203-Q need only output, to the optical I/Q modulator 205, a driving signal having an amplitude capable of obtaining the maximum amplitude independently of the operation mode.

However, in a case where the function of giving the characteristic opposite to the input/output characteristic of the MZ modulator 300 to the pre-equalization unit 2002 of the DSP 200 is not implemented, or the function is OFF, if the optical I/Q modulator 205 is driven by the driving signal having an amplitude capable of obtaining the maximum amplitude, distortion occurs in the optical signal after modulation due to the nonlinear characteristic of the MZ modulator 300 in the optical I/Q modulator 205.

In this embodiment, to implement control using a relatively linear driving range of the MZ modulator 300, that is, control for reducing the output amplitude of the optical modulator driver circuits 203-I and 203-Q, a gain control signal GCTL is given to the optical modulator driver circuits 203-I and 203-Q. The gain control signal GCTL can be generated using a control signal CTL described above.

In the linear operation mode (the value of the control signal CTL is "1"), a control signal generation unit 206 described in the 10th and 11th embodiments outputs the gain control signal GCTL that reduces the output amplitude of the optical modulator driver circuits 203-I and 203-Q so that the optical I/Q modulator 205 operates in the linear operation range. In the limit operation mode (the value of the control signal CTL is "0"), the control signal generation unit 206 outputs the gain control signal GCTL that maximizes the output amplitude of the optical modulator driver circuits 203-I and 203-Q.

As the arrangement of the optical modulator driver circuit 203-I according to this embodiment, one of the arrangements shown in FIGS. 3, 4, 7, 9, and 19 to 25 can be used. In FIGS. 7 and 9, Vin is an input signal input to an input terminal 2 of the optical modulator driver circuit 203-I, and Vout is an output signal output from an output terminal 3 of the optical modulator driver circuit 203-I to the optical I/Q modulator 205.

In the arrangement shown in FIG. 7, one of the circuits shown in FIGS. 3, 4, and 19 to 25 is used as an output circuit 11, and a linear variable gain circuit 10 is connected to the preceding stage of the output circuit 11. In the arrangement shown in FIG. 9, one of the circuits shown in FIGS. 3, 4, and 19 to 25 is used as an input circuit 12, and a linear variable gain circuit 13 is connected to the subsequent stage of the input circuit 12. Here, the arrangement of the optical modulator driver circuit 203-I of I channel has been described. This also applies to the arrangement of the optical modulator driver circuit 203-Q of Q channel.

The arrangements of the linear variable gain circuits 10 and 13 are the same as in FIGS. 28 and 29. Note that gain control signals GCT and GCC shown in FIGS. 28 and 29 correspond to the gain control signal GCTL shown in FIGS. 7 and 9.

As the arrangement of the optical modulator driver circuit 203-I according to this embodiment, one of the arrangements shown in FIGS. 30 to 33 can be used. In FIGS. 30 to 33, VinP is a positive-phase input signal input to a positive-phase input terminal 2P of the optical modulator driver circuit 203-I, VinN is a negative-phase input signal input to a negative-phase input terminal 2N of the optical modulator driver circuit 203-I, VoutP is a positive-phase output signal output from a positive-phase output terminal 3P of the optical modulator driver circuit 203-I to the optical I/Q modulator 205, and VoutN is a negative-phase output signal output from a negative-phase output terminal 3N of the optical modulator driver circuit 203-I to the optical I/Q modulator 205. When one of the arrangements shown in FIGS. 30 to 33 is used as the arrangement of the optical modulator driver circuit 203-I, the components cascade-connected in FIG. 7 or 9 can be integrated. Here, the arrangement of the optical modulator driver circuit 203-I of I channel has been described. This also applies to the arrangement of the optical modulator driver circuit 203-Q of Q channel.

INDUSTRIAL APPLICABILITY

The present invention is applicable to an optical modulator driver circuit.

EXPLANATION OF THE REFERENCE NUMERALS AND SIGNS

1 . . . optical modulator driver circuit, 2, 2P, 2N, 7P, 7N . . . input terminal, 3, 3P, 3N, 8P, 8N . . . output terminal, 4 . . . operation mode switching control terminal, 5, 5P, 5N . . . gain control terminal, 6 . . . bias terminal, 10, 13, 59, 60 . . . linear variable gain circuit, 11 . . . output circuit, 12 . . . input circuit, 20P, 20N, 30 . . . input transmission line, 21P, 21N, 31 . . . output transmission line, 32 . . . input signal bias control circuit, 50, 52, 54-58 . . . differential amplifier, 51, 53 . . . current amount adjustment circuit, Q10-Q16, Q20-Q26, Q30, Q31, Q40-Q45, Q50-Q57 . . . transistor, R10-R18, R20-R28, R30-R32, R40-R47, R50-R57 . . . resistor, IS10-IS12, IS20-IS22, IS40, IS50 . . . current source, 200 . . . DSP, 201-I, 201-Q . . . multiplexer, 202-I, 202-Q . . . D/A converter, 203-I, 203-Q . . . optical modulator driver circuit, 204 . . . laser diode, 205 . . . optical I/Q modulator, 206 . . . control signal generation unit, 207 . . . FPGA, 2000 . . . FEC encoding unit, 2001 . . . symbol mapping unit, 2002 . . . pre-equalization unit, 2003 . . . signal spectrum shaping unit, 2004 . . . transmission FE equalization unit

The invention claimed is:

1. An optical modulator driver circuit comprising:
an amplifier that amplifies an input signal and outputs a signal to drive an optical modulator, the amplifier capable of switching presence and absence of linearity of an input/output characteristic of the optical modulator driver circuit in accordance with a first control signal that represents a desired operation mode, and capable of controlling a gain of the optical modulator driver circuit while ensuring the linearity;
wherein the amplifier includes
an amplification unit including an amplification transistor having a base or a gate connected to an input terminal and a collector or a drain connected to an output terminal;
a gain adjustment unit including a gain adjustment transistor cascode-connected to the amplification transistor, the gain adjustment unit adjusting an amplitude of an output signal of the amplification transistor in accordance with a second control signal;
a current source supplying a current to the amplification unit and the gain adjustment unit;
a first emitter resistor or a first source resistor inserted between the current source and an emitter or a source of the amplification transistor; and
a second emitter resistor or a second source resistor inserted between an emitter or a source of the gain adjustment transistor and a collector of the amplification transistor.

2. An optical modulator driver circuit comprising:
an amplifier that amplifies an input signal and outputs a signal to drive an optical modulator;
a current amount adjustment circuit capable of adjusting a current amount of the amplifier in accordance with a first control signal that represents a desired operation mode and switching presence and absence of linearity of an input/output characteristic of the optical modulator driver circuit; and
a linear variable gain circuit provided at one of a preceding stage and a subsequent stage of the amplifier, a gain of the linear variable gain circuit varying in accordance with a second control signal, wherein
the amplifier includes a transistor having a base or a gate connected to an input terminal and a collector or a drain connected to an output terminal; and an emitter resistor or a source resistor inserted between the current amount adjustment circuit and an emitter or a source of the transistor, the current amount adjustment circuit is connected to the transistor, and adjusts an amount of a current flowing through the transistor in accordance with the desired operation mode, and
the linear variable gain circuit comprises:
an amplification unit including an amplification transistor to which the input signal is input;
a gain adjustment unit including a gain adjustment transistor cascode-connected to the amplification transistor, the gain adjustment unit adjusting an amplitude of an output signal of the amplification transistor in accordance with the second control signal;
a current source supplying a current to the amplification unit and the gain adjustment unit;
a first emitter resistor inserted between the constant current source and an emitter of the amplification transistor; and
a second emitter resistor inserted between an emitter of the gain adjustment transistor and a collector of the amplification transistor.

3. The optical modulator driver circuit according to claim 2, wherein the current amount adjustment circuit changes an input/output characteristic of the amplifier and controls linearity of an amplification response to a desired input signal, by adjusting the current amount of the amplifier in accordance with the desired operation mode.

4. The optical modulator driver circuit according to claim 2, wherein the current amount adjustment circuit comprises at least two current sources that are individually ON/OFF-controllable in accordance with the first control signal which is a binary signal representing the desired operation mode, or at least one variable current source capable of continuously controlling the current amount in accordance with the first control signal which is a continuous signal representing the desired operation mode and a desired characteristic.

5. The optical modulator driver circuit according to claim 2, wherein the current amount adjustment circuit comprises an input signal bias control circuit capable of adjusting a DC bias level of the input signal input to the amplifier in accordance with the desired operation mode.

6. The optical modulator driver circuit according to claim 2, further comprising:
an input transmission line having an input end connected to an input terminal of the optical modulator driver circuit and an output end connected to a power supply voltage; and
an output transmission line having an input end connected to the power supply voltage and an output end connected to an output terminal of the optical modulator driver circuit,
a plurality of the amplifiers and a plurality of the current amount adjustment circuits respectively arranged along the input transmission line and the output transmission line, and
an input terminal of each of the amplifiers is connected to the input transmission line, and an output terminal of each of the amplifiers is connected to the output transmission line.

7. An optical modulator driver circuit comprising:
an amplifier that amplifies an input signal and outputs a signal to drive an optical modulator; and
a current amount adjustment circuit capable of adjusting a current amount of the amplifier in accordance with a first control signal that represents a desired operation mode and switching presence and absence of linearity of an input/output characteristic of the optical modulator driver circuit, wherein the amplifier includes
an amplification unit including an amplification transistor having a base or a gate connected to an input terminal and a collector or a drain connected to an output terminal;
a gain adjustment unit including a gain adjustment transistor cascode-connected to the amplification transistor, the gain adjustment unit adjusting an amplitude of an output signal of the amplification transistor in accordance with a second control signal;
a current source supplying a current to the amplification unit and the gain adjustment unit;
a first emitter resistor or a first source resistor inserted between the current source and an emitter or a source of the amplification transistor; and
a second emitter resistor or a second source resistor inserted between an emitter or a source of the gain adjustment transistor and a collector of the amplification transistor;
wherein the current amount adjustment circuit adjusts an amount of a current flowing through the amplification transistor in accordance with the first control signal.

8. The optical modulator driver circuit according to claim 7, wherein
the current source includes at least two current sources, and
the current amount adjustment circuit ON/OFF-controls the current sources individually in accordance with a control signal with a binary value representing the desired operation mode.

9. The optical modulator driver circuit according to claim 7, wherein
the current source includes at least one variable current source, and
the current amount adjustment circuit continuously controls the current amount of the current source in accordance with the continuous control signal representing the desired operation mode and a desired characteristic.

10. An optical transmitter comprising:
a signal processor configured to perform signal processing of transmission data in accordance with an operation configuration of an optical transmission system;
a D/A converter that converts a digital signal processed by the signal processor into an analog signal;
an optical modulator driver circuit of claim 1 that amplifies the signal output from the D/A converter;
an optical modulator that modulates continuous light input from a light source by an output signal from the optical modulator driver circuit and outputs the signal; and
a control signal generator configured to generate a first control signal that controls an operation mode of the optical modulator driver circuit based on information about the operation configuration of the optical transmission system.

11. The optical transmitter according to claim 10, wherein the control signal generator acquires the information about the operation configuration of the optical transmission system from the signal processor.

12. The optical transmitter according to claim 10, further comprising a signal processing controller configured to control the operation configuration of the signal processor in accordance with the operation configuration of the optical transmission system,
wherein the control signal generator acquires the information about the operation configuration of the optical transmission system from the signal processing controller.

13. The optical transmitter according to claim 10, wherein the control signal generator further generates, based on the first control signal, a second control signal that controls a gain of the optical modulator driver circuit.

* * * * *